(12) United States Patent
Arisawa et al.

(10) Patent No.: US 11,312,858 B2
(45) Date of Patent: Apr. 26, 2022

(54) RESIN COMPOSITION, PREPREG, FILM INCLUDING RESIN, METAL FOIL INCLUDING RESIN, METAL-CLAD LAMINATE, AND WIRING BOARD

(71) Applicant: PANASONIC INTELLECTUAL PROPERTY MANAGEMENT CO., LTD., Osaka (JP)

(72) Inventors: Tatsuya Arisawa, Fukushima (JP); Fumito Suzuki, Fukushima (JP); Shunji Araki, Fukushima (JP); Hirohisa Goto, Fukushima (JP); Yuki Inoue, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 199 days.

(21) Appl. No.: 16/629,829

(22) PCT Filed: Jun. 22, 2018

(86) PCT No.: PCT/JP2018/023811
§ 371 (c)(1),
(2) Date: Jan. 9, 2020

(87) PCT Pub. No.: WO2019/012954
PCT Pub. Date: Jan. 17, 2019

(65) Prior Publication Data
US 2021/0079215 A1    Mar. 18, 2021

(30) Foreign Application Priority Data
Jul. 12, 2017   (JP) .............................. JP2017-135895

(51) Int. Cl.
*C08L 71/12*    (2006.01)
*B32B 15/08*    (2006.01)
(Continued)

(52) U.S. Cl.
CPC ............ *C08L 71/126* (2013.01); *B32B 15/08* (2013.01); *C08J 5/043* (2013.01); *C08J 5/18* (2013.01);
(Continued)

(58) Field of Classification Search
CPC ..... C08L 71/12; C08L 71/126; C09D 171/12; C09J 171/12; C08J 2371/12; C08K 5/544; C08K 5/5399; C08G 65/48; C08G 65/485
See application file for complete search history.

(56) References Cited

U.S. PATENT DOCUMENTS

2010/0129676 A1†  5/2010  Fujimoto
2013/0040153 A1   2/2013  Fujimoto et al.
(Continued)

FOREIGN PATENT DOCUMENTS

CN   102617966 A   8/2012
CN   102807658 A   12/2012
(Continued)

OTHER PUBLICATIONS

Partial machine translation of JP-2017057346-A (2017).*
(Continued)

*Primary Examiner* — Kregg T Brooks
(74) *Attorney, Agent, or Firm* — Greenblum & Bernstein, P.L.C.

(57) ABSTRACT

Provided is a resin composition containing: a modified polyphenylene ether compound terminally modified with a substituent having an unsaturated carbon-carbon double bond; a cross-linking curing agent having an unsaturated carbon-carbon double bond in its molecule; a silane coupling agent having a phenylamino group in its molecule; and silica. A content of the silica is 60 to 250 parts by mass with
(Continued)

respect to a total of 100 parts by mass of the modified polyphenylene ether compound and the cross-linking curing agent.

10 Claims, 5 Drawing Sheets

(51) Int. Cl.
| | |
|---|---|
| *C08J 5/04* | (2006.01) |
| *C08J 5/18* | (2006.01) |
| *C08J 5/24* | (2006.01) |
| *C08K 3/36* | (2006.01) |
| *C08K 5/00* | (2006.01) |
| *C08K 5/3492* | (2006.01) |
| *C08K 5/5399* | (2006.01) |
| *C08K 5/544* | (2006.01) |

(52) U.S. Cl.
CPC .................................... *C08J 5/24* (2013.01); *C08K 3/36* (2013.01); *C08K 5/0025* (2013.01); *C08K 5/0066* (2013.01); *C08K 5/34924* (2013.01); *C08K 5/5399* (2013.01); *C08K 5/544* (2013.01); *B32B 2250/02* (2013.01); *B32B 2250/03* (2013.01); *B32B 2457/08* (2013.01); *C08J 2371/12* (2013.01)

(56) References Cited

U.S. PATENT DOCUMENTS

| | | | |
|---|---|---|---|
| 2014/0044918 A1 | 2/2014 | Zeng | |
| 2016/0060429 A1* | 3/2016 | Kitai | C08K 3/36 |
| | | | 174/258 |
| 2016/0168378 A1† | 6/2016 | Umehara | |
| 2017/0164469 A1 | 6/2017 | Kitai et al. | |
| 2017/0226302 A1 | 8/2017 | Saito et al. | |
| 2018/0170005 A1 | 6/2018 | Saito et al. | |

FOREIGN PATENT DOCUMENTS

| | | | | |
|---|---|---|---|---|
| CN | 105694425 | | | 6/2016 |
| JP | 2001-081305 | | | 3/2001 |
| JP | 2001-81305 | A | † | 3/2001 |
| JP | 2009-179730 | | | 8/2009 |
| JP | 2015-004009 | | | 1/2015 |
| JP | 2015-173153 | A | | 10/2015 |
| JP | 2016-028885 | | | 3/2016 |
| JP | 2016-056367 | | | 4/2016 |
| JP | 2016-210856 | | | 12/2016 |
| JP | 2017057346 | A | * | 3/2017 |
| JP | 2017-214525 | | | 12/2017 |
| TW | 2017-14951 | | | 5/2017 |
| WO | 2015/064064 | | | 5/2015 |

OTHER PUBLICATIONS

Partial machine translation of JP 2016/0060429 A (2016).*
Official Communication issued in International Patent Application No. PCT/JP2018/023811, dated Sep. 18, 2018, along with an English translation thereof.
Yu Shouwu et al. "Modification of polymer materials, Principle and Technology" 1$^{st}$ edition Intellectual Property Publishing House, p. 297, May 31, 2015, partial translation.

* cited by examiner
† cited by third party

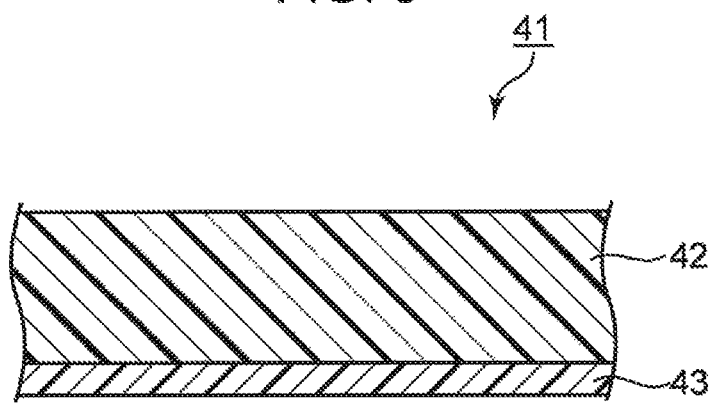

RESIN COMPOSITION, PREPREG, FILM INCLUDING RESIN, METAL FOIL INCLUDING RESIN, METAL-CLAD LAMINATE, AND WIRING BOARD

TECHNICAL FIELD

The present invention relates to a resin composition, a prepreg, a film with resin, a metal foil with resin, a metal-clad laminate, and a wiring board.

BACKGROUND ART

Along with an increase in amount of information to be processed, mounting techniques involving high integration of a semiconductor device to be incorporated, high density of wiring, and making multilayer and the like rapidly develop in various electronic devices. A wiring board compatible with high-frequency waves such as a millimeter-wave radar substrate for in-vehicle use is required in the various electronic devices.

When a signal is transmitted to the wiring provided in the wiring board, a transmission loss due to a conductor forming the wiring, a transmission loss due to a dielectric around the wiring, and the like occur. The transmission loss has been known to be particularly apt to occur when a high-frequency signal is transmitted to wiring provided in a wiring board. From this, the wiring board is required to have a reduced loss during signal transmission in order to increase a signal transmission speed. The wiring board compatible with high-frequency waves is particularly required to have the reduced loss. In order to satisfy this requirement, a material having a low dielectric constant and a low dielectric tangent and excellent dielectric properties is considered to be used as a substrate material for producing an insulating layer constituting a wiring board.

A wiring board such as a printed wiring board is required to suppress increases in a dielectric constant and a dielectric tangent, and the thermal expansion of an insulating layer to suppress the occurrence of warpage of the insulating layer. For this purpose, it is considered to use a material having a low thermal expansion coefficient as the substrate material for producing the insulating layer constituting the wiring board. In a wiring board on which electronic components and the like are mounted at a high density, an amount of heat generation per unit area increases. In order to reduce the occurrence of problems due to the increase in the amount of heat generation, it is considered to improve the heat release property of the wiring board. For this purpose, it is considered to use a material having a high thermal conductivity as the substrate material for producing the insulating layer constituting the wiring board. In order to satisfy these requirements, it is considered to add an inorganic filler such as silica to the substrate material for producing the insulating layer constituting the wiring board. Examples of such a substrate material include a resin composition described in Patent Document 1.

Patent Document 1 discloses a curable composition containing a radically polymerizable compound having an unsaturated bond in its molecule, an inorganic filler containing a metal oxide, and a dispersant having an acidic group and a basic group. The content of the metal oxide is 80 parts by mass or more and 100 parts by mass or less with respect to 100 parts by mass of the inorganic filler. In the curable composition, the remaining composition excluding the inorganic filler is an organic component. The content of the inorganic filler is 80 parts by mass or more and 400 parts by mass or less with respect to 100 parts by mass of the organic component. The content of the dispersant is 0.1 parts by mass or more and 5 parts by mass or less with respect to 100 parts by mass of the inorganic filler.

Patent Document 1 discloses that a cured product having excellent dielectric properties, excellent heat resistance, and a low thermal expansion coefficient can be suitably produced.

CITATION LIST

Patent Literature

Patent Literature 1: Japanese Unexamined Patent Publication No. 2016-56367

SUMMARY OF INVENTION

The present invention has been made in view of such circumstances, and an object of the present invention is to provide a resin composition that provides a cured product having excellent dielectric properties, moldability, and heat-resistant reliability and containing a relatively large amount of silica. Another object of the present invention is to provide a prepreg, a film with resin, a metal foil with resin, a metal-clad laminate, and a wiring board that are obtained using the resin composition.

One aspect of the present invention is a resin composition containing: a modified polyphenylene ether compound terminally modified with a substituent having an unsaturated carbon-carbon double bond; a cross-linking curing agent having an unsaturated carbon-carbon double bond in its molecule; a silane coupling agent having a phenylamino group in its molecule; and silica, in which a content of the silica is 60 to 250 parts by mass with respect to a total of 100 parts by mass of the modified polyphenylene ether compound and the cross-linking curing agent.

The above and other objects, features and advantages of the present invention will be apparent from the following detailed description.

BRIEF DESCRIPTION OF DRAWINGS

FIG. 5 is a schematic cross-sectional view showing the configuration of a film with resin according to an embodiment of the present invention.

DESCRIPTION OF EMBODIMENTS

Figure 1:
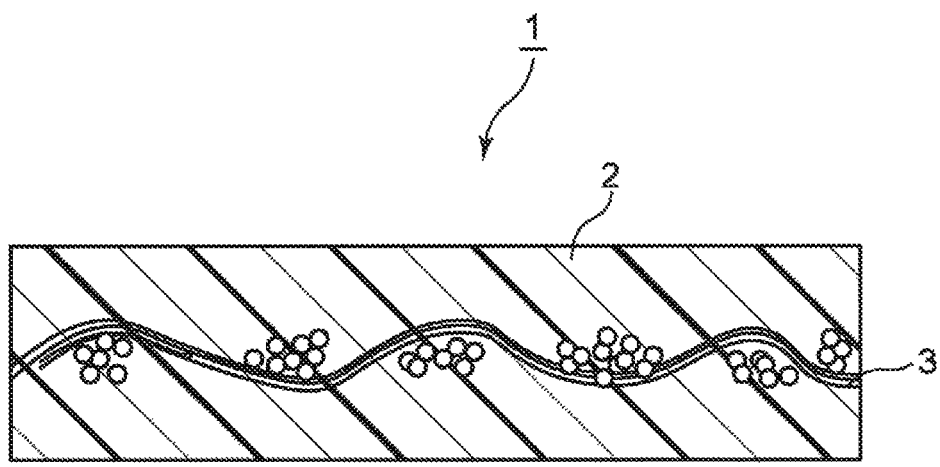
FIG. 1 is a schematic cross-sectional view showing the configuration of a prepreg according to an embodiment of the present invention.

As described above, a wiring board such as a printed wiring board is further required to have a reduced loss during signal transmission in order to increase a signal transmission speed. Therefore, in order to reduce the loss during signal transmission in the wiring board, it is required to use a material having a lower dielectric constant and dielectric tangent as a substrate material.

The present inventors have focused attention on an increase in the content of silica contained in a substrate material for producing an insulating layer constituting a wiring board in order to further increase a thermal conductivity and further decrease a thermal expansion coefficient.

However, according to the studies by the present inventors, the present inventors found that problems due to the addition of silica tend to occur when an attempt is made to achieve a required thermal conductivity and low thermal expansion coefficient by increasing the content of the silica. Specific examples thereof include a decrease in an interlayer adhesive force between insulating layers in a metal-clad laminate, and a decrease in an adhesive force between a metal layer and an insulating layer. As a result, the present inventors found that interlayer peeling may occur during heating, which tends to cause a metal-clad laminate having insufficient heat-resistant reliability. The present inventors also found that a resin composition having a high silica content tends to have deteriorated moldabilities such as resin fluidity and circuit packing.

As a result of various studies, the present inventors found that the object of providing a resin composition that provides a cured product having excellent dielectric properties, moldability, and heat-resistant reliability and containing a relatively large amount of silica is achieved by the following present invention.

Hereinafter, embodiments according to the present invention will be described, but the present invention is not limited thereto.

A resin composition according to the present embodiment contains: a modified polyphenylene ether compound terminally modified with a substituent having an unsaturated carbon-carbon double bond; a cross-linking curing agent having an unsaturated carbon-carbon double bond in its molecule; a silane coupling agent having a phenylamino group in its molecule; and silica.

The modified polyphenylene ether compound used in the present embodiment is not particularly limited as long as it is a polyphenylene ether terminally modified with a substituent having an unsaturated carbon-carbon double bond.

The substituent having an unsaturated carbon-carbon double bond is not particularly limited. Examples of the substituent include a substituent represented by the following formula (1).

[Chemical Formula 1]

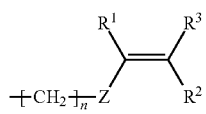

(1)

In the formula (1), "n" represents 0 to 10. Z represents an arylene group. $R^1$ to $R^3$ are each independent. That is, $R^1$ to $R^3$ may each be the same group or different groups. $R^1$ to $R^3$ represent a hydrogen atom or an alkyl group.

In the formula (1), when n is 0, Z is directly bonded to a terminal of the polyphenylene ether.

The arylene group is not particularly limited. Specific examples of the arylene group include a monocyclic aromatic group such as a phenylene group, and a polycyclic aromatic group that has not a monocyclic aromatic ring but a polycyclic aromatic ring such as a naphthalene ring. The arylene group also contains a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group. The alkyl group is not particularly limited, and is preferably an alkyl group having 1 to 18 carbon atoms, and more preferably an alkyl group having 1 to 10 carbon atoms, for example. Specific examples thereof include a methyl group, an ethyl group, a propyl group, a hexyl group, and a decyl group.

More specific examples of the substituent include a vinylbenzyl group (ethenylbenzyl group) such as a p-ethenylbenzyl group or an m-ethenylbenzyl group, a vinylphenyl group, an acrylate group, and a methacrylate group.

Specific preferable examples of the substituent represented by the formula (1) include a functional group containing a vinyl benzyl group. Specific examples thereof include at least one substituent selected from the following formula (2) or (3).

[Chemical Formula 2]

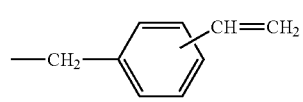

(2)

[Chemical Formula 3]

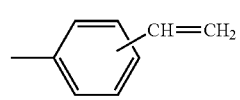

(3)

Examples of another substituent having an unsaturated carbon-carbon double bond that is terminally modified in the modified polyphenylene ether used in the present embodiment include a (meth)acrylate group, which is represented by, for example, the following formula (4).

[Chemical Formula 4]

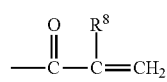

(4)

In the formula (4), $R^8$ represents a hydrogen atom or an alkyl group. The alkyl group is not particularly limited, and is preferably an alkyl group having 1 to 18 carbon atoms, and more preferably an alkyl group having 1 to 10 carbon atoms, for example. Specific examples thereof include a methyl group, an ethyl group, a propyl group, a hexyl group, and a decyl group.

The modified polyphenylene ether preferably has a polyphenylene ether chain in its molecule, and for example, preferably has a repeating unit represented by the following formula (5) in its molecule.

[Chemical Formula 5]

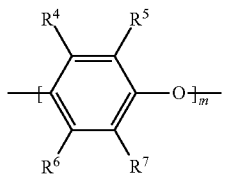

In the formula (5), "m" represents 1 to 50. $R^4$ to $R^7$ are each independent. That is, $R^4$ to $R^7$ may each be the same group or different groups. $R^4$ to $R^7$ each represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

The functional groups mentioned in $R^4$ to $R^7$ are specifically exemplified as follows.

The alkyl group is not particularly limited, but, for example, an alkyl group having 1 to 18 carbon atoms is preferable, and an alkyl group having 1 to 10 carbon atoms is more preferable. Specific examples thereof include a methyl group, an ethyl group, a propyl group, a hexyl group, and a decyl group.

The alkenyl group is not particularly limited, but, for example, an alkenyl group having 2 to 18 carbon atoms is preferable, and an alkenyl group having 2 to 10 carbon atoms is more preferable. Specific examples thereof include a vinyl group, an allyl group, and a 3-butenyl group.

The alkynyl group is not particularly limited, but, for example, an alkynyl group having 2 to 18 carbon atoms is preferable, and an alkynyl group having 2 to 10 carbon atoms is more preferable. Specific examples thereof include an ethynyl group and a prop-2-yn-1-yl (propargyl) group.

The alkylcarbonyl group is not particularly limited as long as it is a carbonyl group substituted with an alkyl group, but, for example, an alkylcarbonyl group having 2 to 18 carbon atoms is preferable, and an alkylcarbonyl group having 2 to 10 carbon atoms is more preferable. Specific examples thereof include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group, but, for example, an alkenylcarbonyl group having 3 to 18 carbon atoms is preferable, and an alkenylcarbonyl group having 3 to 10 carbon atoms is more preferable. Specific examples thereof include an acryloyl group, a methacryloyl group, and a crotonoyl group.

The alkynylcarbonyl group is not particularly limited as long as it is a carbonyl group substituted with an alkynyl group, but, for example, an alkynylcarbonyl group having 3 to 18 carbon atoms is preferable, and an alkynylcarbonyl group having 3 to 10 carbon atoms is more preferable. Specific examples thereof include a propioloyl group.

The weight average molecular weight (Mw) of the modified polyphenylene ether compound used in the present embodiment is not particularly limited. Specifically, the weight average molecular weight (Mw) of the modified polyphenylene ether compound is preferably 500 to 5,000, more preferably 800 to 4,000, and still more preferably 1,000 to 3,000. Here, the weight average molecular weight may be any value as measured by a general molecular weight measuring method, and specific examples thereof include a value measured with use of gel permeation chromatography (GPC). When the modified polyphenylene ether compound has a repeating unit represented by the formula (5) in its molecule, "m" is preferably such a numerical value that provides the weight average molecular weight of the modified polyphenylene ether compound in such a range. Specifically, "m" is preferably 1 to 50.

When the weight average molecular weight of the modified polyphenylene ether compound is in such a range, the modified polyphenylene ether compound has excellent dielectric properties of the polyphenylene ether, and provides a cured product having not only more excellent heat resistance but also excellent moldability. This is considered to be due to following reasons. A normal polyphenylene ether having a weight average molecular weight in such a range has a relatively low molecular weight, so that the polyphenylene ether tends to provide a cured product having low heat resistance. In this respect, it is considered that the modified polyphenylene ether compound has an unsaturated double bond at its terminal, which provides a cured product having sufficiently high heat resistance. It is considered that, when the weight average molecular weight of the modified polyphenylene ether compound is in such a range, the modified polyphenylene ether compound has a relatively low molecular weight, and has also excellent moldability. Therefore, it is considered that such a modified polyphenylene ether compound provides a cured product having not only more excellent heat resistance but also excellent moldability.

In the modified polyphenylene ether compound used in the present embodiment, the average number of the substituents (number of terminal functional groups) per molecule of the modified polyphenylene ether compound at its molecular terminal are not particularly limited. Specifically, the average number is preferably 1 to 5, more preferably 1 to 3, and still more preferably 1.5 to 3. If the number of such terminal functional groups is too small, cured products having sufficient heat resistance tend to be less likely to be obtained. If the number of terminal functional groups is too large, the reactivity becomes excessively high, which may cause problems such as deterioration in the storability of the resin composition or deterioration in the flow properties of the resin composition, for example. That is, when such a modified polyphenylene ether compound is used, insufficient flow properties and the like cause molding defects such as void formation during multilayer molding, which may cause a moldability problem that makes it difficult to obtain a wiring board having high reliability.

The number of the terminal functional groups of the modified polyphenylene ether compound is exemplified by a numerical number that expresses the average number of all the substituents per molecule of the polyphenylene ether copolymer present in a mole of the modified polyphenylene ether compound. This number of terminal functional groups can be measured by, for example, measuring the number of hydroxyl groups remaining in the obtained modified polyphenylene ether compound and calculating the amount of decrease from the number of hydroxyl groups of the polyphenylene ether prior to modification. The amount of decrease from the number of hydroxyl groups of the polyphenylene ether prior to modification is the number of terminal functional groups. The number of hydroxyl groups remaining in the modified polyphenylene ether compound can be obtained by adding, to a solution of the modified polyphenylene ether compound, a quaternary ammonium salt (tetraethylammonium hydroxide) that associates with hydroxyl groups and measuring the UV absorbance of the mixed solution.

The intrinsic viscosity of the modified polyphenylene ether compound used in the present embodiment is not particularly limited. Specifically, the intrinsic viscosity of the modified polyphenylene ether compound is 0.03 to 0.12 dl/g, preferably 0.04 to 0.11 dl/g, and more preferably 0.06 to 0.095 dl/g. If the intrinsic viscosity is too low, the molecular weight tends to be low and low dielectric properties such as a low dielectric constant and a low dielectric tangent tend to be less likely to be obtained. If the intrinsic viscosity is too high, the viscosity is high, and sufficient flow properties are not obtained, which tends to cause deteriorated moldability of the cured product. Accordingly, if the intrinsic viscosity of the modified polyphenylene ether compound falls within the above range, excellent heat resistance and moldability of the cured product can be achieved.

Here, "intrinsic viscosity" refers to the intrinsic viscosity measured in methylene chloride at 25° C. More specifically, this is a value obtained by measuring, for example, a 0.18 g/45 ml methylene chloride solution (liquid temperature: 25° C.) with a viscometer. Examples of the viscometer include AVS500 Visco System manufactured by Schott Instruments GmbH.

A method for synthesizing a modified polyphenylene ether compound used in the present embodiment is not particularly limited as long as it can synthesize a modified polyphenylene ether compound terminally modified with a substituent having an unsaturated carbon-carbon double bond. Specific examples of the method include a method for reacting the polyphenylene ether with a compound in which the substituent having an unsaturated carbon-carbon double bond is bonded to a halogen atom.

Examples of the compound in which the substituent having the unsaturated carbon-carbon double bond is bonded to the halogen atom include a compound represented by the formula (6).

[Chemical Formula 6]

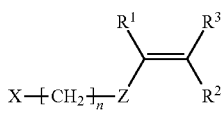
(6)

In the formula (6). "n", "Z", and $R^1$ to $R^3$ are the same as those in the formula (1). Specifically, "n" represents 0 to 10. Z represents an arylene group. $R^1$ to $R^3$ are each independent. That is, $R^1$ to $R^3$ may each be the same group or different groups. $R^1$ to $R^3$ represent a hydrogen atom or an alkyl group. "X" represents a halogen atom, and specific examples thereof include a chlorine atom, a bromine atom, an iodine atom, and a fluorine atom. Among these, a chlorine atom is preferable.

The compounds represented by the formula (6) and exemplified above may be used alone or in combination of two or more.

Examples of the compound in which the substituent having the unsaturated carbon-carbon double bond is bonded to the halogen atom include p-chloromethylstyrene and m-chloromethylstyrene.

The polyphenylene ether as a raw material is not particularly limited as long as it can synthesize a predetermined modified polyphenylene ether compound in the end. Specific examples thereof include a polyphenylene ether formed of 2,6-dimethylphenol and at least one of bifunctional phenol and trifunctional phenol, and one containing as a main component a polyphenylene ether such as poly(2,6-dimethyl-1,4-phenylene oxide). The bifunctional phenol refers to a phenolic compound having two phenolic hydroxy groups in its molecule, and examples thereof include tetramethyl bisphenol A. The trifunctional phenol refers to a phenolic compound having three phenolic hydroxy groups in its molecule. More specific examples of the polyphenylene ether include a polyphenylene ether having a structure represented by the following formula (7), (9), or (10).

[Chemical Formula 7]

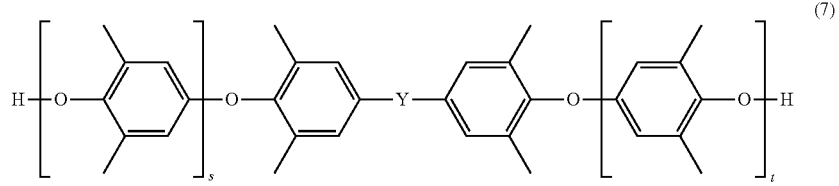
(7)

In the formula (7), the total value of "s" and "t" is preferably 1 to 30, for example. "s" is preferably 0 to 20, and "t" is preferably 0 to 20. That is, it is preferable that "s" represents 0 to 20, "t" represents 0 to 20, and the sum of "s" and "t" represents 1 to 30. "Y" represents a linear, branched or cyclic hydrocarbon group. Examples of "Y" include a group represented by the following formula (8).

[Chemical Formula 8]

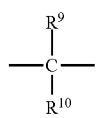
(8)

In the formula (8), $R^9$ and $R^{10}$ each independently represent a hydrogen atom or an alkyl group. Examples of the alkyl group include a methyl group. Examples of the group represented by the formula (8) include a methylene group, a methylmethylene group, and a dimethylmethylene group.

[Chemical Formula 9]

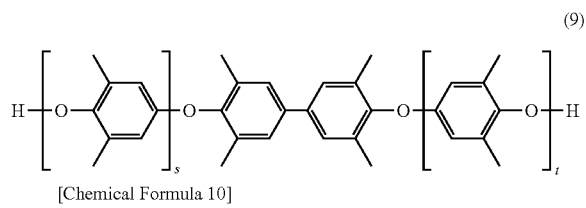

(9)

[Chemical Formula 10]

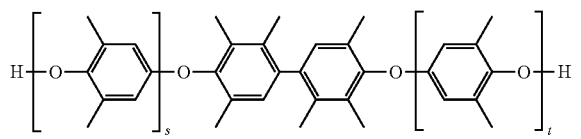

(10)

In the formulae (9) and (10), "s" and "t" are the same as those in the formula (7).

Examples of the modified polyphenylene ether compound include a modified polyphenylene ether compound obtained by terminally modifying the polyphenylene ether having a structure represented by the formula (7), (9), or (10) with the substituent having an unsaturated carbon-carbon double bond as described above. Examples of the modified polyphenylene ether compound include a modified polyphenylene ether compound having the group represented by the formula (1) or (4) at the terminal of the polyphenylene ether represented by the formula (7), (9), or (10). More specific examples thereof include modified polyphenylene ether compounds represented by the following formulae 11 to (16).

[Chemical Formula 11]

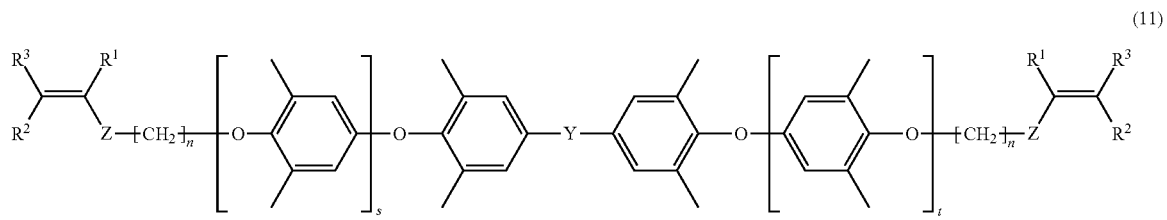

(11)

In the formula 11, "s" and "t" are the same as those in the formula (7), and "Y" is the same as that in the formula (7). In the formula 11, $R^1$ to $R^3$ are the same as those in the formula (1); "Z" is the same as that in the formula (1); and "n" is the same as that in the formula (1).

[Chemical Formula 12]

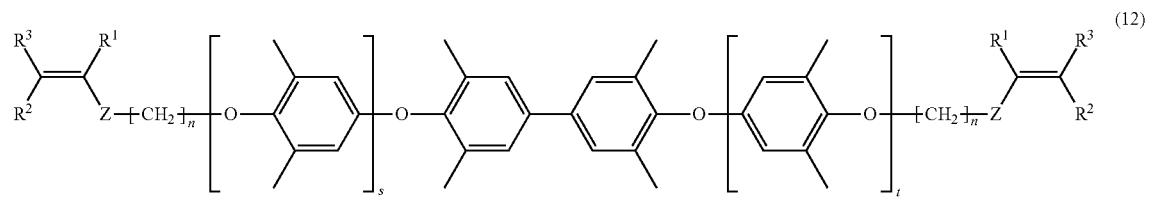

(12)

[Chemical Formula 13]

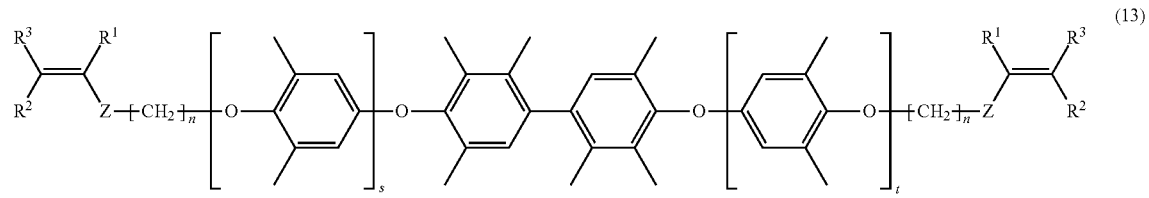

(13)

In the formulae (12) and (13), "s" and "t" are the same as those in the formula (7). In the formulae (12) and (13), $R^1$ to $R^3$ are the same as those in the formula (1); "Z" is the same as that in the formula (1); and "n" is the same as that in the formula (1).

[Chemical Formula 14]

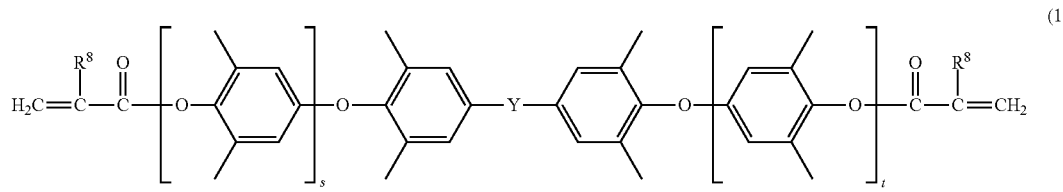

In the formula (14), "s" and "t" are the same as those in the formula (7), and "Y" is the same as that in the formula (7). In the formula (14), $R^8$ is the same as that in the formula (4).

[Chemical Formula 15]

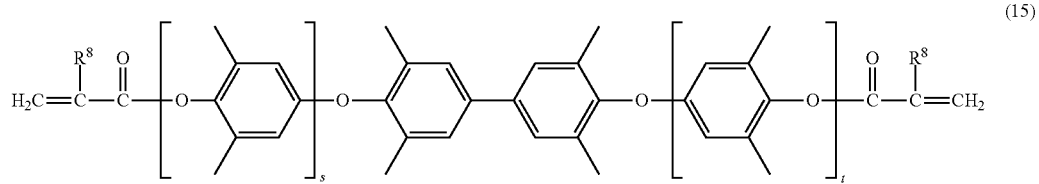

[Chemical Formula 16]

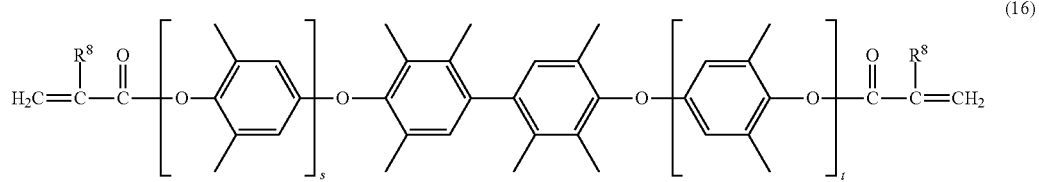

In the formulae (15) and (16), "s" and "t" are the same as those in the formula (7). In the formulae (15) and (16), $R^8$ is the same as that in the formula (4).

Examples of the method for synthesizing the modified polyphenylene ether compound include the methods described above. Specifically, the polyphenylene ether as described above and the compound represented by the formula (6) are dissolved and stirred in a solvent. Consequently, the polyphenylene ether and the compound represented by the formula (6) react with each other, whereby the modified polyphenylene ether compound used in the present embodiment is obtained.

The reaction is preferably performed in the presence of an alkali metal hydroxide. This is considered to suitably promote the reaction. This is considered to be because the alkali metal hydroxide functions as a dehydrohalogenation agent, specifically as a dehydrochlonation agent. That is, the alkali metal hydroxide removes hydrogen halide from the phenolic groups in the polyphenylene ether and the compound represented by the formula (6). As a result, in place of the hydrogen atoms of the phenolic groups in the polyphenylene ether, the substituents represented by the formula (1) are considered to be bonded to the oxygen atoms of the phenolic groups.

The alkali metal hydroxide is not particularly limited as long as it can function as a dehalogenation agent, and examples thereof include sodium hydroxide. The alkali metal hydroxide is usually used in the form of an aqueous solution. Specifically, the alkali metal hydroxide is used as an aqueous solution of sodium hydroxide.

The reaction conditions such as a reaction time and a reaction temperature are different depending on the compound represented by the formula (6) and are not particularly limited as long as the reaction suitably proceeds.

Specifically, the reaction temperature is preferably room temperature to 100° C., and more preferably 30 to 100° C. The reaction time is preferably from 0.5 to 20 hours, and more preferably from 0.5 to 10 hours.

The solvent used for the reaction is not particularly limited as long as it can dissolve the polyphenylene ether and the compound represented by the formula (6) and does not inhibit the reaction between the polyphenylene ether and the compound represented by the formula (6). Specific examples thereof include toluene.

The reaction is preferably performed in the presence of not only the alkali metal hydroxide but also a phase-transfer catalyst. That is, the reaction is preferably performed in the presence of the alkali metal hydroxide and the phase-transfer catalyst. This is considered to more suitably promote the reaction. This is considered to be due to following reasons. It is considered that the phase-transfer catalyst, which has the function of acquiring the alkali metal hydroxide, is soluble both in a polar solvent phase such as water, and in a nonpolar solvent phase such as an organic solvent, and is a catalyst that can move the phases. Specifically, an aqueous solution of sodium hydroxide is used as the alkali metal hydroxide, and an organic solvent such as toluene, that is incompatible with water, is used as the solvent. It is considered that, in this case, even when the aqueous solution of sodium hydroxide is dropped into the solvent used in the reaction, the solvent and the aqueous solution of sodium hydroxide are separated from each other, so that the sodium hydroxide is less likely to be transferred to the solvent. Consequently, it is considered that the aqueous solution of sodium hydroxide added as the alkali metal hydroxide is less likely to contribute to promoting the reaction. In contrast, it is considered that, when the polyphenylene ether is reacted with the compound represented by the formula (6) in the presence of the alkali metal hydroxide and the phase-transfer catalyst, the alkali metal hydroxide is taken into the phase-transfer catalyst and transferred to the solvent, so that the aqueous solution of sodium hydroxide is likely to contribute to promoting the reaction. This is considered to be the reason why the reaction more suitably proceeds in the presence of the alkali metal hydroxide and the phase-transfer catalyst.

The phase-transfer catalyst is not particularly limited, and examples thereof include a quaternary ammonium salt such as a tetra-n-butylammonium bromide.

The resin composition used in the present embodiment preferably contains, as the modified polyphenylene ether compound, the modified polyphenylene ether compound obtained as described above.

The cross-linking curing agent used in the present embodiment is not particularly limited as long as it has an unsaturated carbon-carbon double bond in its molecule. That is, the cross-linking curing agent can be anything that can react with the modified polyphenylene ether compound and cure the resin composition by forming a cross-link in the resin composition. The cross-linking curing agent is preferably a compound having two or more unsaturated carbon-carbon double bonds in its molecule.

The cross-linking curing agent used in the present embodiment preferably has a weight average molecular weight of 100 to 5,000, more preferably 100 to 4,000, and still more preferably 100 to 3,000. If the weight average molecular weight of the cross-linking curing agent is too low, the cross-linking curing agent may easily volatilize from the blended component system of the resin composition. If the weight average molecular weight of the cross-linking curing agent is too high, the viscosity of a varnish of the resin composition and melt viscosity during heat molding may become excessively high. Therefore, if the weight average molecular weight of the cross-linking curing agent is in such a range, the resin composition that provides a cured product having more excellent heat resistance is obtained. This is considered to be because a crosslink can be suitably formed due to the reaction of the cross-linking curing agent with the modified polyphenylene ether compound. Here, the weight average molecular weight may be any value as measured by a general molecular weight measuring method, and specific examples thereof include a value measured with use of gel permeation chromatography (GPC).

The average number of the unsaturated carbon-carbon double bonds in the molecule (the number of terminal double bonds) of the cross-linking curing agent used in the present embodiment differs depending on the weight average molecular weight of the cross-linking curing agent. For example, it is preferably 1 to 20, and more preferably 2 to 18. When the number of terminal double bonds is too small, cured products having sufficient heat resistance tend to be less likely to be obtained. If the number of terminal double bonds is too large, the reactivity becomes excessively high, which may cause problems such as deterioration in the storability of the resin composition and deterioration in the flow properties of the resin composition, for example.

In further consideration of the weight average molecular weight of the cross-linking curing agent, the number of terminal double bonds of the cross-linking curing agent is preferably 1 to 4 when the weight average molecular weight of the cross-linking curing agent is less than 500 (for example, 100 or more and less than 500). When the weight average molecular weight of the cross-linking curing agent is 500 or more (for example, 500 or more and 5,000 or less), the number of terminal double bonds of the cross-linking curing agent is preferably 3 to 20. In the respective cases, when the number of terminal double bonds is smaller than the lower limit value of the above range, the cross-linking curing agent may have low reactivity, to cause a decrease in the crosslink density of the cured product of the resin composition, so that the heat resistance and the Tg may not be sufficiently improvable. Meanwhile, when the number of terminal double bonds is more than the upper limit value of the above range, the resin composition may be easily gelled.

The number of terminal double bonds here can be found from the product specification value of the cross-linking curing agent to be used. Specific examples of the number of terminal double bonds here include a numerical value representing the average number of all double bonds per molecule of the cross-linking curing agent present in one mole.

Specific examples of the cross-linking curing agent used in the present embodiment include: a trialkenyl isocyanurate compound such as triaryl isocyanurate (TAIC); a polyfunctional methacrylate compound having two or more methacrylic groups in its molecule; a polyfunctional acrylate compound having two or more acrylic groups in its molecule; a vinyl compound (polyfunctional vinyl compound) having two or more vinyl groups in its molecule such as polybutadiene; and a vinylbenzyl compound having a vinylbenzyl group in its molecule such as styrene and divinylbenzene. Among these, preferable is one having two or more carbon-carbon double bonds in its molecule. Specific examples thereof include: a trialkenyl isocyanurate compound, a polyfunctional acrylate compound, a polyfunctional methacrylate compound, a polyfunctional vinyl compound, and a divinylbenzene compound. It is considered that, when these are used, the curing reaction more suitably forms a cross-link, and the heat resistance of the cured product of the resin composition used in the present embodiment can be further improved. As the cross-linking curing agent, the exemplified cross-linking curing agents may be used alone or in combination of two or more. A compound having two or more unsaturated carbon-carbon double bonds in its molecule and a compound having one unsaturated carbon-carbon double bond in its molecule may be used in combination as the cross-linking curing agent. Specific examples of the compound having one unsaturated carbon-carbon double bond in its molecule a compound (monovinyl compound) having one vinyl group in its molecule.

The content of the modified polyphenylene ether compound is preferably 30 to 90 parts by mass, and preferably 50 to 90 parts by mass with respect to a total of 100 parts by mass of the modified polyphenylene ether compound and the cross-linking curing agent. The content of the cross-linking curing agent is preferably 10 to 70 parts by mass, and 10 to 50 parts by mass with respect to a total of 100 parts by mass of the modified polyphenylene ether compound and the cross-linking curing agent. That is, the content ratio of the modified polyphenylene ether compound to the cross-linking curing agent is preferably 90:10 to 30:70 at a ratio by mass, and more preferably 90:10 to 50:50. If each of the contents of the modified polyphenylene ether compound and the cross-linking curing agent satisfies the above ratio, the resin composition that provides a cured product having more excellent heat resistance and flame retardance is obtained. This is considered to be because the curing reaction between the modified polyphenylene ether compound and the cross-linking curing agent suitably proceeds.

As described above, the resin composition contains the silane coupling agent and the silica in addition to the modified polyphenylene ether compound and the cross-linking curing agent.

The silane coupling agent used in the present embodiment is not particularly limited as long as it is a silane coupling agent having a phenylamino group in its molecule. Examples of the silane coupling agent include N-phenyl-3-aminopropyltrimethoxysilane and N-phenyl-3-aminopropyltriethoxysilane.

The silica used in the present embodiment is not particularly limited. Examples of the silica include crushed silica and silica particles. The silica may be silica that is subjected to a surface treatment, or silica that is not subjected to a surface treatment. Examples of the surface treatment include a treatment using a silane coupling agent.

The content of the silica is 60 to 250 parts by weight, preferably 100 to 250 parts by weight, more preferably 120 to 230 parts by weight, and still more preferably 150 to 200 parts by mass with respect to 100 parts by weight as a total of the modified polyphenylene ether compound and the cross-linking curing agent. If the content of the silica is too small, the thermal conductivity tends to be insufficiently increased or the thermal expansion coefficient tends to be insufficiently reduced. If the content of the silica is too large, the addition of the silica tends to be apt to cause problems. Specifically, dielectric properties, moldability, and heat-resistant reliability and the like tend to be deteriorated. Therefore, the content of the silica is set to be within the above range, which makes it possible to increase a thermal conductivity and reduce a thermal expansion coefficient while maintaining excellent dielectric properties, moldability, and heat-resistant reliability.

The content of the silane coupling agent is preferably 0.3 to 5 parts by mass, more preferably 0.5 to 4.5 parts by mass, and still more preferably 1 to 3 parts by mass with respect to 100 parts by mass of the silica. If the content of the silane coupling agent is too small, heat-resistant reliability tends to be deteriorated. Specifically, an interlayer adhesive force is decreased, which tends to cause interlayer peeling and the like to occur during heating. When the content of the silane coupling agent is too high, dielectric properties, moldability, and heat-resistant reliability tend to be deteriorated. Therefore, the content of the silane coupling agent is set to be within the above range, which makes it possible to maintain excellent dielectric properties, moldability, and heat-resistant reliability even when the addition of the silica particles increases the thermal conductivity and reduces the thermal expansion coefficient.

When the resin composition is produced, the silica previously surface-treated with the silane coupling agent may be added, or the silica and the silane coupling agent may be added by an integral blend method.

The resin composition may also contain a dispersant. The dispersant is not particularly limited, and examples thereof include a wet dispersant. Examples of the dispersant include a dispersant containing an acidic group and a basic group, that is, an amphoteric dispersant. The dispersant may contain both an acidic group and a basic group in one molecule, or may contain a molecule having an acidic group and a molecule having a basic group. The dispersant may also contain other functional groups as long as it contains both an acidic group and a basic group. Examples of the other functional groups include hydrophilic functional groups such as a hydroxy group.

Examples of the acidic group include a carboxy group, an acid anhydride group, a sulfonic group (sulfo group), a thiol group, a phosphate group, an acidic phosphoric acid ester group, a hydroxy group, and a phosphonic acid group. Among these acidic groups, a phosphate group, a carboxy group, a hydroxy group, and a sulfo group are preferable, and a phosphate group and a carboxy group are more preferable.

Examples of the basic group include an ammonium salt group such as an amino group, an imino group, and an alkylol ammonium salt group, an imidazoline group, a pyrrole group, an imidazole group, a benzimidazole group, a pyrazole group, a pyridine group, a pyrimidine group, a pyrazine group, a pyrrolidine group, a piperidine group, a piperazine group, an indole group, an indoline group, a purine group, a quinoline group, an isoquinoline group, a quinuclidine group, and a triazine group. Among these, the basic group is preferably an amino group, an imidazoline group, an ammonium salt group, a pyrrole group, an imidazole group, a benzimidazole group, a pyrazole group, a pyridine group, a pyrimidine group, a pyrazine group, a pyrrolidine group, a piperidine group, a piperazine group, an indole group, an indoline group, a purine group, a quinoline group, an isoquinoline group, a quinuclidine group, and a triazine group, and more preferably an amino group and an imidazoline group.

The dispersant may contain, as the acidic group, one or two or more of the acidic groups exemplified above. The dispersant may contain, as the basic group, one or two or more of the basic groups exemplified above.

Specifically, a dispersant containing a phosphate group and an imidazoline group, and a dispersant containing a carboxy group and an amino group are preferably used as the dispersant. Examples of the dispersant containing a phosphate group and an imidazoline group include BYK-W969 (phosphoric-acid-ester-based dispersant) manufactured by BYK Japan KK. Examples of the dispersant containing a carboxy group and an amino group include BYK-W966 (higher fatty acid ester-based dispersant) manufactured by BYK Japan KK.

The acid value of the dispersant is preferably 30 to 150 mg KOH/g, and more preferably 30 to 100 mg KOH/g in terms of the solid content. If the acid value is too small, the dispersibility of the silica cannot be sufficiently improved and, as a result, moldability tends to be deteriorated. If the acid value is too large, the cured product tend to have poor heat resistance such as a low Tg, a poor adhesive force, and poor electrical properties. The acid value represents an acid value per 1 g of the dispersant solid. The acid value can be measured by potentiometric titration in conformity with DIN EN ISO 2114.

The amine value of the dispersant is preferably 30 to 150 mgKOH/g, and more preferably 30 to 100 mgKOH/g in terms of the solid content. More preferably, the amine value is substantially the same as the acid value. If the amine value is too low relative to the acid value, the influence of the acid value becomes large. In this case, the radical curing system is adversely affected and, as a result, the cured product tends to have poor heat resistance such as a low Tg, a poor adhesive force, and poor electrical properties. If the amine value is too large relative to the acid value, the influence of the amine value becomes large and this great influence tends to cause low dispersibility and consequent poor moldability, and poor electrical properties of the cured product. The amine value represents an amine value per 1 g of the dispersant solid. The amine value can be measured by potentiometric titration in conformity with DIN16945 in which a 0.1-N HClO$_4$ acetic acid aqueous solution is used.

The content of the dispersant is preferably 0.1 to 5 parts by mass, more preferably 0.3 to 3 parts by mass, and still more preferably 0.5 to 2 parts by mass with respect to 100 parts by mass of the silica. If the content of the dispersant is too small, the moldability of the resin composition tends to be deteriorated. This is considered to be because the effect of improving the dispersibility of silica in the organic component by the dispersant cannot be sufficiently exhibited. If the content of the dispersant is too large, there is a tendency that the heat resistance of the cured product cannot be sufficiently improved. This is considered to be because the dispersant contains both an acidic group and a basic group and therefore too much of the dispersant leads to too high moisture absorption. Therefore, when the content of the dispersant is within the range, the resin composition providing a cured product having more excellent moldability and heat resistance can be obtained.

The resin composition may contain a flame retardant. The flame retardant may be a bromine flame retardant or a phosphorus flame retardant. For example, in the field where a halogen-free flame retardant is required, a phosphorus flame retardant is preferable.

Specific examples of the bromine flame retardant include ethylene dipentabromobenzene, ethylene bistetrabromoimide, decabromodiphenyloxyde, tetradecabromodiphenoxybenzene, ethylenebis(pentabromophenyl), and bis(tribromophenoxy)ethane. Among these, ethylenebis(pentabromophenyl) is preferable.

Examples of the phosphorus flame retardant include a phosphoric-acid-ester-based flame retardant, a phosphazene-based flame retardant, and a phosphinate-based flame retardant. The phosphorus flame retardant preferably contains a compatible phosphorus compound compatible with the mixture of the modified polyphenylene ether compound and the cross-linking curing agent, and an incompatible phosphorus compound incompatible with the mixture.

The compatible phosphorus compound is not particularly limited as long as it acts as a flame retardant and is compatible with the mixture. In this case, the term "compatible" means being in a finely dispersed stated, for example, on the molecular level in the mixture of the modified polyphenylene ether compound and the cross-linking curing agent. Examples of the compatible phosphorus compound include compounds containing phosphorus and not forming salts such as a phosphate ester compound, a phosphazene compound, a phosphite ester compound, and a phosphine compound. Examples of the phosphazene compound include a cyclic or chain phosphazene compound. The cyclic phosphazene compound is also called cyclophosphazene, contains double bonds phosphorus and nitrogen as constituent elements in its molecule, and has a cyclic structure. Examples of the phosphate ester compound include triphenyl phosphate; tricresyl phosphate; xylenyl-diphenyl phosphate; cresyl-diphenyl phosphate; 1,3-phenylenebis(di-2,6-xylenyl phosphate); 9,10-dihydro-9-oxa-10-phospha-phenanthrene-10-oxide (DOPO); a condensed phosphate compound such as an aromatic condensed phosphate compound; and a cyclic phosphate compound. Examples of the phosphite ester compound include trimethylphosphite and triethylphosphite. Examples of the phosphine compound include tris-(4-methoxyphenyl)phosphine and triphenylphosphine. The compatible phosphorus compounds may be used alone or in combination of two or more. Among the compatible phosphorus compounds exemplified above, a phosphazene compound is preferable.

The incompatible phosphorus compound is not particularly limited as long as it is an incompatible phosphorus compound that acts as a flame retardant and is not compatible with the mixture. The term "incompatible" in this case refers to a state in which the object (phosphorus compound) is incompatible in the mixture of the modified polyphenylene ether compound and the cross-linking curing agent and dispersed in an island from in the mixture. Examples of the incompatible phosphorus compound include compounds containing phosphorus and forming salts such as a phosphinate compound, a polyphosphate compound, and a phosphonium salt compound, and a phosphine oxide compound. Examples of the phosphinate compound include aluminum dialkyiphosphinate, aluminum trisdiethylphosphinate, aluminum trismethylethylphosphinate, aluminum trisdiphenylphosphinate, zinc bisdiethylphosphinate, zinc bismethylethylphosphinate, zinc bisdiphenylphosphinate, titanyl bisdiethylphosphinate, titanyl bismethylethylphosphinate, and titanyl bisdiphenylphosphinate. Examples of the polyphosphate compound include melamine polyphosphate, melam polyphosphate, and melem polyphosphate. Examples of the phosphonium salt compound include tetraphenylphosphonium tetraphenylborate and tetraphenylphosphonium bromide. Examples of the phosphine oxide compound include a phosphine oxide compound having two or more diphenylphosphine oxide groups in its molecule. The incompatible phosphorus compounds may be used alone or in combination of two or more. Among the incompatible phosphorus compounds exemplified above, a phosphinate compound is preferable.

The resin composition used in the present embodiment uses the compatible phosphorus compound and the incompatible phosphorus compound in combination as the flame retardant, as described above, whereby the flame retardance of the obtained cured product can be improved as compared with the case of using either one of the compatible phosphorus compound and the incompatible phosphorus alone. The use of the compatible phosphorus compound and the incompatible phosphorus compound in combination is considered to make it possible to improve the flame retardance of the obtained cured product while sufficiently suppressing the inhibition of the curing reaction between the modified polyphenylene ether compound and the cross-linking curing agent. Furthermore, it is considered that the inhibition of the curing reaction is sufficiently suppressed, whereby deterioration in the heat resistance of the cured product can also be sufficiently suppressed. From these, it is considered that the resin composition provides the cured product having more excellent heat resistance and flame retardance. When any one of the compatible phosphorus compound and the incompatible phosphorus compound is used as the flame retardant, the flame retardance tends to be insufficient. When any one of the compatible phosphorus compound and the incompatible phosphorus compound is used as the flame retardant, it is necessary to contain the compatible phosphorus compound or the incompatible phosphorus compound in a large amount in order to secure the same degree of flame retardance as that in the combination use. Thus, it is considered that the dielectric properties, and the heat resistance of the cured product, and the like are deteriorated in the case of not the combination use as the flame retardant but a mere increase in the content. From this, when the combination use is employed as the flame retardant, the content as described later can improve the flame retardance while suppressing deteriorations in the dielectric properties and the heat resistance of the cured product, and the like.

The content of the compatible phosphorus compound is preferably 3 to 19% by mass, more preferably 5 to 15% by mass, and still more preferably 5 to 13% by mass with respect to the total content of the compatible phosphorus compound and the incompatible phosphorus compound. That is, the content ratio of the compatible phosphorus compound and the incompatible phosphorus compound is preferably 3:97 to 20:80 at a ratio by mass, more preferably 3:97 to 19:81, still more preferably 5:95 to 15:85, and yet still more preferably 5:95 to 13:87. Such a content ratio provides the resin composition providing the cured product having more excellent flame retardance, dielectric properties, moldability, and heat-resistant reliability while maintaining excellent dielectric properties of the polyphenylene ether. This is considered to be because the above effect of using the compatible phosphorus compound and the incompatible phosphorus compound in combination as the flame retardant can be further exhibited while deteriorations in dielectric properties, moldability, and heat-resistant reliability are sufficiently suppressed.

The content of the compatible phosphorus compound is 1 to 3.5 parts by mass, preferably 1 to 3 parts by mass, and more preferably 2 to 3 parts by mass with respect to a total of 100 parts by mass of the modified polyphenylene ether compound and the cross-linking curing agent. If the amount of the compatible phosphorus compound is too small, there is a tendency that the effect of improving the flame retardance using the compatible phosphorus compound and the incompatible phosphorus compound in combination cannot be sufficiently exhibited. If the content of the compatible phosphorus compound is too large, interlayer adhesiveness tends to be deteriorated. Therefore, by adding the compatible phosphorus compound so as to have the above content, the interlayer adhesiveness can be improved while the flame retardance is improved.

The content of the incompatible phosphorus compound is 14 to 30 parts by mass, preferably 14 to 25 parts by mass, and more preferably 14 to 22 parts by mass with respect to a total of 100 parts by mass of the modified polyphenylene ether compound and the cross-linking curing agent. If the amount of the incompatible phosphorus compound is too small, there is a tendency that the effect of improving the flame retardance using the compatible phosphorus compound and the incompatible phosphorus compound in combination cannot be sufficiently exhibited. If the content of the incompatible phosphorus compound is too large, the total amount of the flame retardant is too large, which tends to cause deteriorations in dielectric properties and heat-resistant reliability. Therefore, by adding the incompatible phosphorus compound so as to have the above content, deterioration in the heat-resistant reliability and the like can be suppressed while the flame retardance is improved, and excellent dielectric properties are maintained.

The flame retardant may be composed of the compatible phosphorus compound and the incompatible phosphorus compound, or may contain a flame retardant other than the compatible phosphorus compound and the incompatible phosphorus compound.

The resin composition may contain a filler other than the silica. Examples of the filler include, but are not particularly limited to, one added to improve the heat resistance and the flame retardance of the cured product of the curable composition and to improve dimensional stability during heating. That is, the addition of the filler can improve the heat resistance and the flame retardance and improve the dimensional stability during heating. Specific examples of the filler include metal oxides such as alumina, titanium oxide, and mica, metal hydroxides such as aluminum hydroxide and magnesium hydroxide, talc, aluminum borate, barium sulfate, and calcium carbonate.

The resin composition used in the present embodiment may contain an additive. Examples of the additive include antifoaming agents such as a silicone-based antifoaming agent and an acrylate-based antifoaming agent, an antioxidant, a thermostabilizer, an antistatic agent, an ultraviolet absorber, a dye, a pigment, and a lubricant.

By using the resin composition according to the present embodiment, a prepreg, a metal-clad laminate, a wiring board, and a metal foil with resin can be obtained as follows.

FIG. 1 is a schematic cross-sectional view showing an example of a prepreg 1 according to an embodiment of the present invention.

As shown in FIG. 1, the prepreg 1 according to the present embodiment contains the resin composition or a semi-cured product 2 of the resin composition, and a fibrous base material 3. Examples of the prepreg 1 include one in which the fibrous base material 3 is present in the resin composition or the semi-cured product 2. That is, the prepreg 1 includes the resin composition or the semi-cured product 2, and the fibrous base material 3 present in the resin composition or the semi-cured product 2.

In the present embodiment, the semi-cured product is a product obtained by partway curing the resin composition to such an extent that the product can be further cured. That is, the semi-cured product is in a semi-cured state of the resin composition (in a stage B). For example, when the resin composition is heated, the resin composition gradually decreases the viscosity at first, and thereafter starts to be cured with a gradual increase of viscosity. In such a case, examples of semi-curing include a state from the viscosity starting to increase to before the resin composition being completely cured.

The prepreg obtained by using the resin composition according to the present embodiment may include the semi-cured product of the resin composition as described above, or may include the resin composition that is not yet cured. That is, the prepreg may include the semi-cured product of the resin composition (the resin composition in the stage B) and the fibrous base material, or may include the resin composition that is not yet cured (the resin composition in a stage A) and the fibrous base material. Specific examples of the prepreg include one in which the fibrous base material is present in the resin composition.

In prepreg production, in order to impregnate the fibrous base material 3 serving as a base material for prepreg formation with the resin composition 2, the resin composition 2 prepared into varnish is usually used. That is, the resin composition 2 is usually a resin varnish prepared into varnish. The resin varnish is prepared as follows, for example.

First, components that can be dissolved in an organic solvent, such as a modified polyphenylene ether compound, a cross-linking curing agent, and a silane coupling agent, are added to and dissolved in the organic solvent. In this case, heating may be conducted as needed. Thereafter, a component that is used as needed and is not dissolved in the organic solvent, for example, silica or the like, is added to and dispersed in the mixed solution with use of a ball mill, a bead mill, a planetary mixer, or a roller mill or the like, until the solution becomes a predetermined dispersed state. Thus, a varnish-like composition is prepared. The organic solvent used here is not particularly limited as long as the organic solvent dissolves the modified polyphenylene ether compound, the cross-linking curing agent, and the silane coupling agent and the like and does not inhibit the curing reaction. Specific examples thereof include toluene and methyl ethyl ketone (MEK).

Examples of the method for producing the prepreg 1 include a method in which the fibrous base material 3 is impregnated with the resin composition 2 such as the resin composition 2 prepared into varnish, and then dried.

Specific examples of the fibrous base material 3 used in the production of the prepreg 1 include glass cloth, aramid cloth, polyester cloth, nonwoven glass fabric, nonwoven aramid fabric, nonwoven polyester fabric, pulp paper, and linter paper. The use of the glass cloth provides a laminate having excellent mechanical strength. In particular, glass cloth subjected to a flattening treatment is preferable. Specific examples of the flattening treatment include a method for continuously applying an appropriate level of pressure to glass cloth with a press roll to compress yarns of the glass cloth flat. Examples of the fibrous base material include one having a thickness of 0.04 to 0.3 mm.

The fibrous base material 3 is impregnated with the resin composition 2 by immersion and application and the like. This impregnation can also be repeated a plurality of times, as needed. In this case, it is also possible to adjust the composition and an amount to be impregnated of the resin composition to finally intended ones by repeating the impregnation with use of a plurality of resin compositions having different compositions and concentrations.

The fibrous base material 3 that has been impregnated with the resin composition 2 is heated under desired heating conditions, for example, a temperature of 80° C. or higher and 180° C. or lower for a period of 1 minute or more and 10 minutes or less. By heating, the prepreg 1 that is not yet cured (stage A) or in the semi-cured state (stage B) is obtained.

The resin composition according to the present embodiment is a resin composition that provides a cured product having excellent dielectric properties, moldability, and heat-resistant reliability and containing a relatively large amount of silica. For this reason, the prepreg obtained by using the resin composition can exhibit the effect provided by adding a relatively large amount of silica while maintaining excellent dielectric properties, moldability, and heat-resistant reliability. That is, the prepreg can achieve a high thermal conductivity and a low thermal expansion coefficient while maintaining excellent dielectric properties, moldability, and heat-resistant reliability. The prepreg can produce a metal-clad laminate and a wiring board that exhibit the effect provided by adding a relatively large amount of silica while maintaining excellent dielectric properties, moldability, and heat-resistant reliability.

Figure 2:
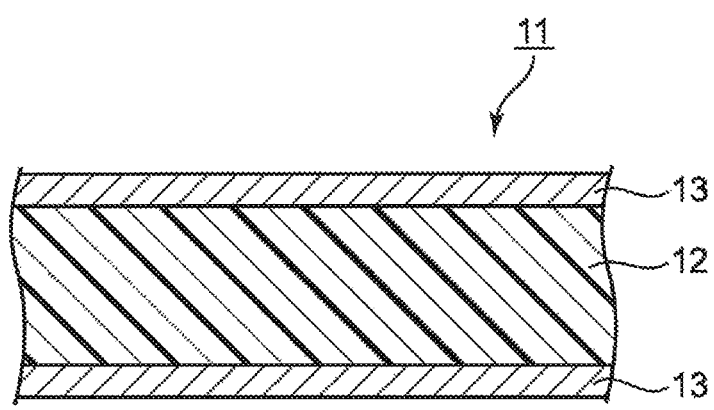
FIG. 2 is a schematic cross-sectional view showing the configuration of a metal-clad laminate according to an embodiment of the present invention.

FIG. 2 is a schematic sectional view showing an example of a metal-clad laminate 11 according to an embodiment of the present invention.

As shown in FIG. 2, the metal-clad laminate 11 includes an insulating layer 12 containing the cured product of the prepreg 1 shown in FIG. 1 and a metal foil 13 laminated on the insulating layer 12. That is, the metal-clad laminate 11 includes the metal foil 13 on the insulating layer 12 containing the cured product of the resin composition. The metal-clad laminate 11 includes the insulating layer 12 containing the cured product of the resin composition, and the metal foil 13 bonded to the insulating layer 12.

Examples of the method for preparing the metal-clad laminate 11 with use of the prepreg 1 include a method for stacking a prepreg or a plurality of prepregs with a metal foil 13 such as a copper foil stacked on both or one surface of the stacked body and integrally laminating the metal foil 13 and the prepreg 1 by hot-press molding, to prepare a double-sided metal-clad or single-sided metal-clad laminate 11. That is, the metal-clad laminate 11 is obtained by laminating the metal foil 13 on the prepreg 1 and subjecting the laminated body to hot-press molding. A hot press condition can be appropriately set according to the thickness of the metal-clad laminate 11 to be produced and the type of the composition contained in the prepreg 1, and the like. For example, the temperature can be set to 170° C. to 210° C.; the pressure can be set to 3.5 MPa to 4 MPa; and the period can be set to 60 minutes to 150 minutes. The metal-clad laminate may be produced without using the prepreg. Examples of the method for producing the metal-clad laminate without using the prepreg include a method for applying the resin composition such as a varnish-like resin composition onto the metal foil to form a layer containing the resin composition on the metal foil, and then hot-pressing the metal foil on which the layer has been formed.

The metal-clad laminate 11 may be prepared by forming a varnish-like resin composition on the metal foil 13 without using the prepreg 1 and then hot-pressing the metal foil on which the resin composition has been formed.

The resin composition according to the present embodiment is a resin composition that provides a cured product having excellent dielectric properties, moldability, and heat-resistant reliability and containing a relatively large amount of silica. For this reason, the metal-clad laminate obtained by using the resin composition can exhibit the effect provided by adding a relatively large amount of silica while maintaining excellent dielectric properties, moldability, and heat-resistant reliability. That is, the metal-clad laminate can achieve a high thermal conductivity and a low thermal expansion coefficient while maintaining excellent dielectric properties, moldability, and heat-resistant reliability. The metal-clad laminate can produce a wiring board that exhibits the effect provided by adding a relatively large amount of silica while maintaining excellent dielectric properties, moldability, and heat-resistant reliability.

Figure 3:
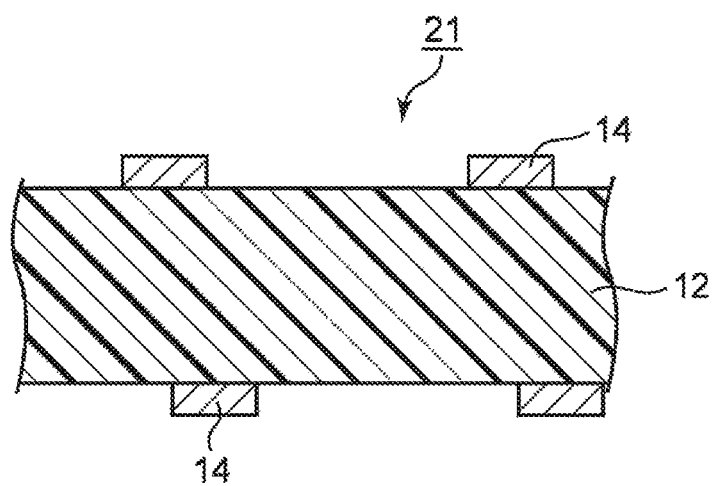
FIG. 3 is a schematic cross-sectional view showing the configuration of a wiring board according to an embodiment of the present invention.

FIG. 3 is a schematic cross-sectional view showing an example of a wiring board 21 according to an embodiment of the present invention.

As shown in FIG. 3, the wiring board 21 according to the present embodiment includes an insulating layer 12 obtained by curing the prepreg 1 shown in FIG. 1 and wiring 14 disposed on the insulating layer 12 and wiring 14 formed by partially removing the metal foil 13. That is, the wiring board 21 includes the wiring 14 on the insulating layer 12 containing the cured product of the resin composition. The wiring board 21 includes the insulating layer 12 containing the cured product of the resin composition, and the wiring 14 bonded to the insulating layer 12.

The metal foil 13 on the surface of the prepared metal-clad laminate 11 is subjected to a procedure such as etching to form the wiring. Thus, the wiring board 21 including the wiring that is provided as a circuit on the surface of the insulating layer 12 is obtained. That is, the wiring board 21 is obtained by partially removing the metal foil 13 on the surface of the metal-clad laminate 11 to form a circuit. The wiring board 21 includes the insulating layer 12 having excellent dielectric properties, moldability, and heat-resistant reliability, and having a high thermal conductivity and a low thermal expansion coefficient.

The wiring board exhibits the effect provided by adding a relatively large amount of silica while maintaining excellent dielectric properties, moldability, and heat-resistant reliability.

Figure 4:
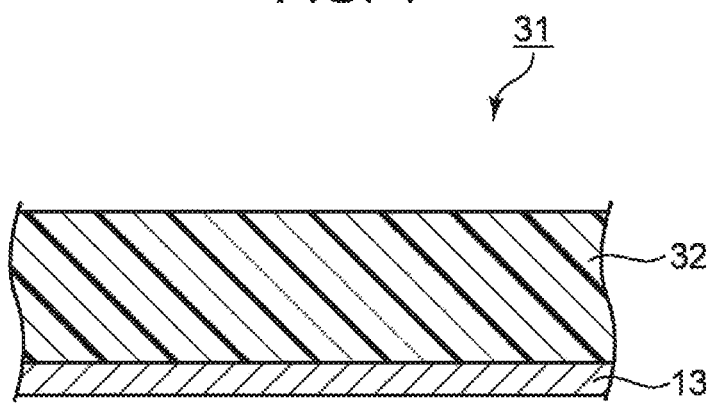
FIG. 4 is a schematic cross-sectional view showing the configuration of a metal foil with resin according to an embodiment of the present invention.

FIG. 4 is a schematic cross-sectional view showing an example of a metal foil with resin 31 according to the present embodiment.

As shown in FIG. 4, a metal foil with resin 31 according to the present embodiment includes a resin layer 32 containing the resin composition or a semi-cured product of the resin composition, and a metal foil 13. The metal foil with resin 31 includes the metal foil 13 on the surface of the resin layer 32. That is, the metal foil with resin 31 includes the resin layer 32 and the metal foil 13 laminated on the resin layer 32. The metal foil with resin 31 may include another layer between the resin layer 32 and the metal foil 13.

The resin layer 32 may include the semi-cured product of the resin composition as described above, or may include the resin composition that is not yet cured. That is, the metal foil with resin 31 may include the resin layer containing the semi-cured product of the resin composition (resin composition in the stage B) and the metal foil, or may include the composition layer containing the resin composition that is not yet cured (resin composition in the stage A), and the metal foil. The resin layer may contain the resin composition or the semi-cured product of the resin composition, and may or may not contain a fibrous base material. As the fibrous base material, the same fibrous base material as that in the prepreg can be used.

As the metal foil, it is possible to use, without any limitation, a metal foil that is used for the metal foil with resin and the metal-clad laminate. Examples of the metal foil include a copper foil and an aluminum foil.

The metal foil with resin 31 is produced by, for example, applying the varnish-like resin composition onto the metal foil 13 and then heating the resultant. The varnish-like resin composition is applied onto the metal foil 13 by using, for example, a bar coater. The applied resin composition is heated under conditions, for example, a temperature of 80° C. or higher and 180° C. or lower for a duration of 1 minute or more and 10 minutes or less. The heated resin composition is formed as the resin layer 32 in an uncured state on the metal foil 13.

The resin composition according to the present embodiment is a resin composition that provides a cured product having excellent dielectric properties, moldability, and heat-resistant reliability and containing a relatively large amount of silica. For this reason, the metal foil with resin obtained by using the resin composition can exhibit the effect provided by adding a relatively large amount of silica while maintaining excellent dielectric properties, moldability, and heat-resistant reliability. That is, the metal foil with resin can achieve a high thermal conductivity and a low thermal expansion coefficient while maintaining excellent dielectric properties, moldability, and heat-resistant reliability. The metal foil with resin can be used when a wiring board is produced. Therefore, the metal foil with resin can produce a wiring board that exhibits the effect provided by adding a relatively large amount of silica while maintaining excellent dielectric properties, moldability, and heat-resistant reliability.

FIG. 5 is a schematic cross-sectional view showing an example of a film with resin 41 according to the present embodiment.

As shown in FIG. 5, the film with resin 41 according to the present embodiment includes a resin layer 42 containing the resin composition or the semi-cured product of the resin composition, and a support film 43. The film with resin 41 includes the support film 43 on the surface of the resin layer 42. That is, the film with resin 41 includes the resin layer 42 and the support film 43 laminated on the resin layer 42. The film with resin 41 may include another layer between the resin layer 42 and the support film 43.

The resin layer 42 may include the semi-cured product of the resin composition as described above, or may include the resin composition that is not yet cured. That is, the film with resin 41 may include the semi-cured product of the resin composition (resin composition in the stage B) and the support film, or may include the resin layer containing the resin composition that is not yet cured (resin composition in the stage A) and the support film. The resin layer may contain the resin composition or the semi-cured product of the resin composition, and may or may not contain a fibrous base material. As the fibrous base material, the same fibrous base material as that in the prepreg can be used.

As the support film 43, it is possible to use, without any limitation, a support film used for the film with resin. Examples of the support film include a polyester film and a polyethylene terephthalate film.

The film with resin 41 is produced by, for example, applying the varnish-like resin composition onto the support film 43 and then heating the resultant. The varnish-like resin composition is applied onto the support film 43 by using, for example, a bar coater. The applied resin composition is heated under conditions, for example, a temperature of 80° C. or higher and 180° C. or lower for a duration of 1 minute or more and 10 minutes or less. The heated resin composition is formed as the resin layer 42 in an uncured state on the support film 43.

The resin composition according to the present embodiment is a resin composition that provides a cured product having excellent dielectric properties, moldability, and heat-resistant reliability and containing a relatively large amount of silica. For this reason, the metal foil with resin obtained by using the resin composition can exhibit the effect provided by adding a relatively large amount of silica while maintaining excellent dielectric properties, moldability, and heat-resistant reliability. The film with resin can be used when a wiring board is produced. For example, a multi-layer wiring board can be produced by laminating the film with resin on the wiring board, and then peeling the support film, or peeling the support film, and then laminating the film with resin on the wiring board. The film with resin can achieve a high thermal conductivity and a low thermal expansion coefficient while maintaining excellent dielectric properties, moldability, and heat-resistant reliability. As a wiring board obtained using such a film with resin, it is possible to produce a wiring board that exhibits the effect provided by adding a relatively large amount of silica while maintaining excellent dielectric properties, moldability, and heat-resistant reliability.

As described above, the present specification discloses techniques of various aspects, among which main techniques are summarized below.

One aspect of the present invention is a resin composition containing: a modified polyphenylene ether compound terminally modified with a substituent having an unsaturated carbon-carbon double bond; a cross-linking curing agent having an unsaturated carbon-carbon double bond in its molecule; a silane coupling agent having a phenylamino group in its molecule; and silica, in which a content of the silica is 60 to 250 parts by mass with respect to a total of 100 parts by mass of the modified polyphenylene ether compound and the cross-linking curing agent.

Such a configuration can provide a resin composition that provides a cured product having excellent dielectric properties, moldability, and heat-resistant reliability and containing a relatively large amount of silica. The cured product obtained by curing the resin composition contains a relatively large amount of silica, whereby a high thermal conductivity and a low thermal expansion coefficient can be achieved. Therefore, the resin composition can provide the cured product having excellent dielectric properties, moldability, and heat-resistant reliability while sufficiently exhibiting the effect provided by adding the silica.

This is considered to be due to following reasons. First, it is considered that the resin composition provides the cured product obtained by crosslinking the modified polyphenylene ether compound with the cross-linking curing agent and maintaining the excellent dielectric properties of the polyphenylene ether. It is considered that the addition of the silane coupling agent can suppress the occurrence of problems due to the excessive content of silica while maintaining the excellent dielectric properties of the polyphenylene ether. That is, the silane coupling agent can suppress thickening due to an increase in the amount of silica contained in the resin composition, and deterioration in moldability. It is considered that, even when a plurality of layers are formed with the cured product by the silane coupling agent, the adhesive force between the layers, that is, the interlayer adhesive force is increased. Therefore, it is considered that the curing agent provides the cured product having high heat-resistant reliability. For example, the occurrence of interlayer peeling is suppressed even when the metal-clad laminate or the wiring board on which the cured product is laminated is heated.

Due to the reasons described above, the resin composition that provides the cured product having excellent dielectric properties, moldability, and heat-resistant reliability and containing a relatively large amount of silica is considered to be provided.

In the resin composition, a content of the silane coupling agent is preferably 0.3 to 5 parts by mass with respect to 100 parts by mass of the silica.

Such a configuration can provide the cured product having more excellent dielectric properties, moldability, and heat-resistant reliability.

It is preferable that the resin composition further contains a flame retardant, and the flame retardant contains a compatible phosphorus compound that is compatible with a mixture of the modified polyphenylene ether compound and the cross-linking curing agent, and an incompatible phosphorus compound that is incompatible with the mixture.

Such a configuration can provide the cured product having excellent dielectric properties, moldability, and heat-resistant reliability even when the flame retardant is contained. That is, the resin composition containing the flame retardant tends to cause deteriorations in moldability and interlayer adhesive force. However, when the flame retardant is contained in the resin composition, the deteriorations can be suppressed.

In the resin composition, it is preferable that a content of the compatible phosphorus compound is 3 to 19% by mass with respect to a total content of the compatible phosphorus compound and the incompatible phosphorus compound.

Such a configuration can provide the cured product that can further suppress deteriorations in moldability and interlayer adhesive force even when the flame retardant is contained and has excellent dielectric properties, moldability, and heat-resistant reliability.

In the resin composition, the compatible phosphorus compound is preferably a phosphazene compound.

Such a configuration can provide the cured product that can further suppress deteriorations in moldability and interlayer adhesive force even when the flame retardant is contained and has excellent dielectric properties, moldability, and heat-resistant reliability.

In the resin composition, the substituent is preferably a substituent having at least one selected from the group consisting of a vinylbenzyl group, an acrylate group, and a methacrylate group.

Such a configuration can provide the cured product having more excellent dielectric properties, moldability, and heat-resistant reliability.

In the resin composition, the silica is preferably crushed silica or silica particles.

Such a configuration can provide the resin composition that can suitably provide the cured product having excellent dielectric properties, moldability, and heat-resistant reliability even when containing a relatively large amount of silica.

A prepreg according to another aspect of the present invention includes: the resin composition or a semi-cured product of the resin composition; and a fibrous base material.

Such a configuration can provide the prepreg having excellent dielectric properties, moldability, and heat-resistant reliability.

Another aspect of the present invention is a film with resin including: a resin layer containing the resin composition or a semi-cured product of the resin composition, and a support film.

Such a configuration can provide the film with resin having excellent dielectric properties, moldability, and heat-resistant reliability.

Still another aspect of the present invention is a metal foil with resin including: a resin layer containing the resin composition or a semi-cured product of the resin composition; and a metal foil.

Such a configuration can provide the metal foil with resin having excellent dielectric properties, moldability, and heat-resistant reliability.

Yet still another aspect of the present invention is a metal-clad laminate including: an insulating layer containing a cured product of the resin composition; and a metal foil.

Such a configuration can provide the metal-clad laminate having excellent dielectric properties, moldability, and heat-resistant reliability.

Further another aspect of the present invention is a wiring board including an insulating layer containing a cured product of the resin composition and wiring.

Such a configuration can provide the wiring board having excellent dielectric properties, moldability, and heat-resistant reliability.

The present invention can provide a resin composition that provides a cured product having excellent dielectric properties, moldability, and heat-resistant reliability and containing a relatively large amount of silica. The present invention can provide a prepreg, a metal foil with resin, a metal-clad laminate, and a wiring board that are obtained using the resin composition.

Hereinafter, the present invention will be specifically described with reference to Examples, but the present invention is not limited thereto.

EXAMPLES

Examples 1 to 18 and Comparative Examples 1 to 10

In the present Examples, components used when a resin composition is prepared will be described.

(Polyphenylene Ether Compound: PPE Component)

Modified PPE1: a modified polyphenylene ether compound as a modified polyphenylene ether obtained by modifying a terminal hydroxy group of a polyphenylene ether with a methacrylic group (having a structure represented by the formula (14), where $R^8$ is a methyl group, and "Y" is a dimethylmethylene group (represented by the formula (8), where $R^9$ and $R^{10}$ are methyl groups), SA9000 manufactured by SABIC Innovative Plastics, weight average molecular weight Mw: 1700, the number of terminal functional groups: 2)

Modified PPE2:

a modified polyphenylene ether obtained by reacting a polyphenylene ether with chloromethylstyrene.

Specifically, the modified PPE2 is a modified polyphenylene ether obtained through a reaction described below.

First, into a 1-L three-necked flask equipped with a temperature controller, a stirring device, a cooling unit, and a tap funnel, 200 g of a polyphenylene ether (SA90 manufactured by SABIC Innovative Plastics, 2 terminal hydroxy groups, weight average molecular weight Mw: 1700), 30 g of a mixture of p-chloromethylstyrene and m-chloromethylstyrene at a ratio by mass of 50:50 (chloromethylstyrene (CMS) manufactured by Tokyo Chemical Industry Co., Ltd.), 1.227 g of tetra-n-butylammonium bromide as a phase-transfer catalyst, and 400 g of toluene were charged, followed by stirring. The stirring was conducted until polyphenylene ether, chloromethylstyrene, and tetra-n-butylammonium bromide were dissolved in toluene. During the stirring, the mixture was gradually heated until a liquid temperature reached 75° C. in the end. To the solution, an aqueous sodium hydroxide solution (20 g of sodium hydroxide/20 g of water) as an alkali metal hydroxide was added dropwise over 20 minutes. Then, stirring was conducted at 75° C. for another 4 hours. Next, contents of the flask were neutralized with 10%-by-mass hydrochloric acid, followed by addition of a great amount of methanol. This generated a precipitate in the liquid of the flask. That is, a product contained in the reaction solution in the flask was reprecipitated. The precipitate was taken out by filtration, washed three times with a mixed liquid of methanol and water at a ratio by mass of 80:20, and then dried under reduced pressure at 80° C. for 3 hours.

The obtained solid was subjected to $^1$H-NMR (400 MHz, $CDCl_3$, TMS) analysis. As the result of NMR measurement, a peak attributable to a vinylbenzyl group (ethenylbenzyl group) was confirmed at 5 ppm to 7 ppm. Thus, the obtained solid could be confirmed to be a modified polyphenylene ether having the vinylbenzyl group as a substituent at its molecular terminal in a molecule. Specifically, the obtained solid could be confirmed to be an ethenylbenzylated polyphenylene ether. The obtained modified polyphenylene ether compound was a modified polyphenylene ether compound represented by the formula (11), where "Y" was a dimethylmethylene group (represented by the formula (8), where $R^9$ and $R^{10}$ were methyl groups); "Z" was a phenylene group; $R^1$ to $R^3$ were hydrogen atoms; and "n" was 1.

The number of terminal functional groups in the modified polyphenylene ether was measured as follows.

First, the modified polyphenylene ether was accurately weighed. The weight is defined as X (mg). The modified polyphenylene ether thus weighed was dissolved in 25 mL of methylene chloride. To the solution was added 100 µl, of an ethanol solution containing 10% by mass of tetraethylammonium hydroxide (TEAH) (TEAH:ethanol (volume ratio)=15:85). Then, the solution was measured for absorbance (Abs) at 318 nm with use of a UV spectrophotometer (UV-1600 manufactured by SHIMADZU CORPORATION). Based on the measurement result, the number of terminal hydroxy groups in the modified polyphenylene ether was calculated with use of the following formula.

Remaining OH amount (µmol/g)=[(25×Abs)/(ε× OPL×X)]×10$^6$

Here, ε represents an absorption coefficient, and is 4700 L/mol·cm. OPL is a cell optical path length and is 1 cm.

The remaining OH amount (the number of terminal hydroxy groups) in the modified polyphenylene ether thus calculated was near zero, which indicated that almost all the hydroxy groups in the unmodified polyphenylene ether are modified. This indicated that a decrease in the number of terminal hydroxy groups from the unmodified polyphenylene ether is the number of terminal hydroxy groups in the unmodified polyphenylene ether. That is, this indicated that the number of terminal hydroxy groups in the unmodified polyphenylene ether is the number of terminal functional groups in the modified polyphenylene ether. That is, the number of terminal functional groups was 2.

The modified polyphenylene ether was measured for an intrinsic viscosity (IV) in methylene chloride at 25° C. Specifically, the intrinsic viscosity (IV) of the modified polyphenylene ether was obtained by subjecting a solution containing the modified polyphenylene ether and methylene chloride at a concentration of 0.18 g/45 ml (liquid temperature: 25° C.) to measurement with a viscometer (AVS500 Visco System manufactured by Schott Instruments GmbH). As the result, the intrinsic viscosity (IV) of the modified polyphenylene ether was 0.086 dl/g.

The modified polyphenylene ether was measured for a molecular weight distribution with use of GPC. A weight average molecular weight (Mw) was calculated from the obtained molecular weight distribution. As the result, the Mw was 1900.

(Cross-Linking Curing Agent)

TAIC: triallyl isocyanurate (TALC: manufactured by Nippon Kasei Chemical Company Limited, weight average molecular weight Mw: 249, the number of terminal double bonds: 3)

DVB: divinylbenzene (DVB810 manufactured by NIPPON STEEL & SUMITOMO METAL CORPORATION, molecular weight: 130, the number of terminal double bonds: 2)

(Reaction Initiator)

Peroxide: 1,3-bis(butylperoxyisopropyl)benzene (Perbutyl P manufactured by NOF Corporation)

(Silane Coupling agent)

Vinyl group: silane coupling agent having a vinyl group in its molecule (vinyltriethoxysilane, KBM-1003 manufactured by Shin-Etsu Chemical Co., Ltd.)

Glycidoxy group: silane coupling agent having a glycidoxy group in its molecule (3-glycidoxypropyltriethoxysilane, KBM-403 manufactured by Shin-Etsu Chemical Co., Ltd.)

Methacryloxy group: silane coupling agent having a methacryloxy group in its molecule (3-methacryloxypropyltrimethoxysilane, KBM-503 manufactured by Shin-Etsu Chemical Co., Ltd.)

Amino group: silane coupling agent having an amino group in its molecule (3-aminopropyltriethoxysilane, KBM-903 manufactured by Shin-Etsu Chemical Co., Ltd.)

Phenylamino group: silane coupling agent having a phenylamino group in its molecule (N-phenyl-3-aminopropyltrimethoxysilane, KBM-573 manufactured by Shin-Etsu Chemical Co., Ltd.)

Ureido group: silane coupling agent having a ureido group in its molecule (3-ureidopropyltriethoxysilane, KBE-585 manufactured by Shin-Etsu Chemical Co., Ltd.)

(Flame Retardant: Compatible Phosphorus Compound)

Phosphazene compound: cyclic phosphazene compound (SPB-100 manufactured by Otsuka Chemical Co., Ltd., phosphorus concentration: 13% by mass)

(Flame Retardant: Immiscible Phosphorus Compound)

Phosphine oxide compound: paraxylylene bisdiphenyi-phosphine oxide (PQ60 manufactured by Chin Yee Chemical Industries Ltd.)

Phosphinate compound: aluminum trisdiethylphosphinate (Exolit OP-935 manufactured by Clariant (Japan) K.K., phosphorus concentration: 23% by mass)

(Dispersant)

Dispersant 1: Phosphoric-acid-ester-based dispersant (dispersant having a phosphate group and an imidazoline group, BYK-W969 manufactured by BYK Japan KK., acid value (in terms of the solid content): 75 mgKOH/g, amine value (in terms of the solid content): 75 mgKOH/g)

Dispersant 2: Higher fatty acid ester-based dispersant (dispersant having a carboxyl group and an amino group, BYK-W966 manufactured by BYK Japan KK., acid value (in terms of the solid content): 50 mgKOH/g, amine value (in terms of the solid content): 37 mgKOH/g)

(Silica)

Silica particles: SC-2300SVJ manufactured by Admatechs Co., Ltd.

Crushed silica: Megasil 525 manufactured by Sibelco inc.

[Preparation Method]

First, components were added to toluene and mixed in a blending ratio (parts by mass) shown in Tables 1 to 3 so that a solid content concentration became 60% by mass. The mixture was heated to 80° C., and stirred for 60 minutes while the temperature was kept at 80° C., to obtain a varnish-like resin composition (varnish).

Next, a glass cloth was impregnated with the obtained varnish, and the resultant was heated and dried at a temperature of 100° C. to 170° C. for about 3 minutes to about 6 minutes, to prepare a prepreg. Specifically, the glass cloth is #2116 or E-glass, all manufactured by Nitto Boseki Co., Ltd. In the impregnation, the content (resin content) of the components such as the modified polyphenylene ether compound and the cross-linking curing agent, constituting the resin provided by the curing reaction was adjusted to about 50% by mass.

Four prepregs obtained were stacked, and sandwiched between 35 mm thick copper foils, followed by laminating. The laminated body was heated and pressed under conditions of a temperature of 200° C., 2 hours, a pressure of 3 MPa, to obtain a substrate for evaluation having a thickness of about 0.8 mm (metal-clad laminate: copper foil-clad laminate).

The prepregs and the substrates for evaluation that were prepared as described above were evaluated by methods described below.

[Resin Fluidity]

The resin fluidity of each of the prepregs was measured by the IPC method (the method in conformity with IPC-TM-650 2.3.17.2).

[Circuit Packing]

A circuit was formed by forming a lattice pattern in each of the copper foils on the both surfaces of the copper-clad laminate so that a remaining copper rate was set to 20, 40, 50, 60, and 80%. That is, lattice-like pattern circuits having different remaining copper rates were formed in the surface of the laminate. One prepreg was laminated on each of both surfaces of the substrate on which the circuit was formed, and the resulting laminate was heated and pressurized under the same conditions as those in production of the copper-foil-clad laminate. When, in the formed laminate (laminate for evaluation), all gaps between circuits having different remaining copper rates are sufficiently filled with the resin derived from the prepreg and the like with no void being formed, the laminate was evaluated as "Good". That is, when no void was confirmed in gaps between circuits, the laminate was evaluated as "Good". When voids were confirmed in some of circuits having different remaining copper rates, the laminate was evaluated as "Fair". When voids were confirmed in all gaps between circuits, the laminate was evaluated as "Poor". The voids can be visually confirmed.

[Glass Transition Temperature (Tg)]

The Tg of each prepreg was measured using a "DMS 100" dynamic mechanical spectrometer manufactured by Seiko Instruments. At this time, the frequency in the bending module was set to 10 Hz and dynamic mechanical analysis (DMA) was carried out. The temperature at which tan S reached a maximum when the temperature was raised at a rate of 5° C./min from room temperature to 280° C. was taken as Tg.

[Interlayer Adhesiveness]

First, an insulating layer obtained by curing the prepreg was used as a core material, and the core material was allowed to stand for 240 hours under conditions of a temperature of 85° C. and a relative humidity of 85% to cause the core material to absorb moisture. On the core material after the core material absorbs moisture, the prepreg on the uppermost surface of the multilayer metal-clad laminate obtained by laminating the prepreg was peeled off At this time, a normal adhesion state was evaluated as "Good", and an abnormal adhesion state was evaluated as "Poor". Presence of a portion in a partial abnormal adhesion state in a general adhesion state was evaluated as "Fair".

The normal adhesion state means a so-called material failure state where adhesion strength between the prepregs constituting the multilayer metal-clad laminate is high, and peeling does not occur between the prepregs at the interface between the prepregs, but peeling occurs between the prepreg resin and the glass cloth when an attempt is made to peel off the prepreg on the uppermost surface. The abnormal adhesion state is an adhesion state other than the normal adhesion state. Specific examples thereof include a so-called interface fracture state where peeling occurs at the interface between the prepregs constituting the multilayer metal-clad laminate when an attempt is made to peel off the prepreg on the uppermost surface.

[Heat Resistance (T-288)]

Heat resistance (T-288) is measured by a method in conformity with JIS C 6481. Specifically, the substrate for evaluation is subjected to a pressure cooker test (PCT) at 121° C. and 2 atmospheric pressure (0.2 MPa) for 6 hours. The substrate for evaluation subjected to the PCT was immersed in a solder bath at 288° C. A time until delamination occurred in the immersed substrate for evaluation was measured. If the time is 120 seconds or more, it is mentioned as ↑120" in Tables 1 to 3.

[Dielectric Properties (Relative Dielectric Constant and Dielectric Tangent)]

A relative dielectric constant and a dielectric tangent of the substrate for evaluation were measured at 1 GHz by a method in conformity with IPC-TM650-2.5.5.9. Specifically, the relative dielectric constant and the dielectric tangent of the substrate for evaluation were measured at 1 GHz with use of an impedance analyzer (RF impedance analyzer HP4291B manufactured by Agilent Technologies).

The results in the above evaluations are shown in Tables 1 to 3.

TABLE 1

| | | | Examples | | | Comparative Examples | | | | | |
|---|---|---|---|---|---|---|---|---|---|---|---|
| | | | 1 | 2 | 3 | 1 | 2 | 3 | 4 | 5 | 6 |
| Composition (parts by mass) | PPE | Modified PPE-1 | 70 | 70 | 70 | 70 | 70 | 70 | 70 | 70 | 70 |
| | Cross-linking curing agent | TAIC | 30 | 30 | 30 | 30 | 30 | 30 | 30 | 30 | 30 |
| | Reaction initiator | Peroxide | 1 | 1 | 1 | 1 | 1 | 1 | 1 | 1 | 1 |
| | Silane coupling agent | Phenylamino group | 3.75 | 3.00 | 1.50 | — | — | — | — | — | 4.50 |
| | | Vinyl group | — | — | — | 3.00 | — | — | — | — | — |
| | | Glycidic group | — | — | — | — | 3.00 | — | — | — | — |
| | | Methacryloxy group | — | — | — | — | — | 3.00 | — | — | — |
| | | Amino group | — | — | — | — | — | — | 3.00 | — | — |
| | | Ureido group | — | — | — | — | — | — | — | 3.00 | — |
| | Silica | Silica particles | 250 | 200 | 100 | 200 | 200 | 200 | 200 | 200 | 300 |
| Content of silane coupling agent with respect to 100 parts by mass of silica (parts by mass) | | | 1.5 | 1.5 | 1.5 | 1.5 | 1.5 | 1.5 | 1.5 | 1.5 | 1.5 |
| Evaluation | Resin fluidity | | 11 | 15 | 24 | 0 | 4 | 0 | 0 | 0 | 5 |
| | Circuit packing | | Good | Good | Good | Poor | Fair | Poor | Poor | Poor | Poor |
| | Glass transition temperature (° C.) | | 240 | 240 | 240 | 240 | 240 | 240 | 240 | 240 | 240 |
| | Interlayer adhesiveness | | Good | Good | Good | Good | Good | Good | Good | Good | Good |
| | Heat resistance (seconds) | | ↑120 | ↑120 | ↑120 | ↑120 | ↑120 | ↑120 | ↑120 | ↑120 | ↑120 |
| | Relative dielectric constant | | 3.8 | 3.8 | 3.7 | 3.8 | 3.8 | 3.8 | 3.8 | 3.8 | 4.0 |
| | Dielectric tangent | | 0.002 | 0.002 | 0.002 | 0.002 | 0.002 | 0.002 | 0.002 | 0.002 | 0.002 |

TABLE 2

| | | | Examples | | | | | |
|---|---|---|---|---|---|---|---|---|
| | | | 4 | 5 | 6 | 7 | 8 | 9 |
| Composition (parts by mass) | PPE | Modified PPE-1 | 70 | 70 | 70 | 70 | 70 | 70 |
| | Cross-linking curing agent | TAIC | 30 | 30 | 30 | 30 | 30 | 30 |
| | Reaction initiator | Peroxide | 1 | 1 | 1 | 1 | 1 | 1 |
| | Silane coupling agent | Phenylamino group | 1.00 | 5.00 | 9.00 | 0.30 | 12.50 | 20.00 |
| | Dispersant | Phosphoric-acid-ester-based | — | — | — | — | — | — |
| | | higher fatty acid ester-based | — | — | — | — | — | — |
| | Silica | Silica particles | 200 | 200 | 200 | 200 | 200 | 200 |
| Content of silane coupling agent with respect to 100 parts by mass of silica (parts by mass) | | | 0.5 | 2.5 | 4.5 | 0.15 | 6.25 | 10 |
| Evaluation | Resin fluidity | | 8 | 19 | 25 | 5 | 33 | 39 |
| | Circuit packing | | Good | Good | Good | Fair | Good | Good |
| | Glass transition temperature (° C.) | | 240 | 240 | 230 | 240 | 210 | 200 |
| | Interlayer adhesiveness | | Good | Good | Good | Good | Good | Good |
| | Heat resistance (seconds) | | ↑120 | ↑120 | ↑120 | ↑120 | 38 | 17 |

TABLE 2-continued

|  |  |  |  |  |  |  |
|---|---|---|---|---|---|---|
| Relative dielectric constant | 3.8 | 3.8 | 3.9 | 3.8 | 4.0 | 4.1 |
| Dielectric tangent | 0.002 | 0.002 | 0.003 | 0.002 | 0.003 | 0.004 |

|  |  |  | Comparative Examples |  |  |  |  |
|---|---|---|---|---|---|---|---|
|  |  |  | 7 | 8 | 9 | 10 | 11 |
| Composition (parts by mass) | PPE | Modified PPE-1 | 70 | 70 | 70 | 70 | 70 |
|  | Cross-linking curing agent | TAIC | 30 | 30 | 30 | 30 | 30 |
|  | Reaction initiator | Peroxide | 1 | 1 | 1 | 1 | 1 |
|  | Silane coupling agent | Phenylamino group | — | — | — | — | — |
|  | Dispersant | Phosphoric-acid-ester-based | — | 8.0 | 4.0 | 2.0 | — |
|  |  | higher fatty acid ester-based | — | — | — | — | 4.0 |
|  | Silica | Silica particles | 200 | 200 | 200 | 200 | 200 |
| Content of silane coupling agent with respect to 100 parts by mass of silica (parts by mass) |  |  | 0 | 0 | 0 | 0 | 0 |
| Evaluation | Resin fluidity |  | 0 | 25 | 17 | 10 | 7 |
|  | Circuit packing |  | Poor | Good | Good | Fair | Fair |
|  | Glass transition temperature (° C.) |  | 245 | 230 | 240 | 245 | 240 |
|  | Interlayer adhesiveness |  | Good | Poor | Fair | Fair | Good |
|  | Heat resistance (seconds) |  | ↑120 | ↑120 | ↑120 | ↑120 | ↑120 |
|  | Relative dielectric constant |  | 3.8 | 3.9 | 3.8 | 3.8 | 3.8 |
|  | Dielectric tangent |  | 0.002 | 0.003 | 0.002 | 0.002 | 0.002 |

TABLE 3

|  |  |  | Examples |  |  |  |  |
|---|---|---|---|---|---|---|---|
|  |  |  | 10 | 11 | 12 | 13 | 14 |
| Composition (parts by mass) | PPE | Modified PPE-1 | 70 | 70 | 70 | 70 | — |
|  |  | Modified PPE-2 | — | — | — | — | 85 |
|  | Cross-linking curing agent | TAIC | 30 | 30 | 30 | 30 | — |
|  |  | DVB | — | — | — | — | 15 |
|  | Reaction initiator | Peroxide | 1 | 1 | 1 | 1 | — |
|  | Silane coupling agent | Phenylamino group | 1.80 | 1.50 | 1.20 | 0.90 | 1.00 |
|  | Compatible phosphorus compound | Phosphazene compound | — | — | — | — | — |
|  | Incompatible phosphorus compound | Phosphine oxide compound | — | — | — | — | — |
|  |  | Phosphinate compound | — | — | — | — | — |
|  | Dispersant | Phosphoric-acid-ester-based | 1.2 | — | — | — | — |

TABLE 3-continued

|  |  |  |  |  |  |  |  |
|---|---|---|---|---|---|---|---|
|  | Silica | Silica particles | — | — | — | — | 200 |
|  |  | Crushed silica | 120 | 100 | 80 | 60 | — |
| Content of silane coupling agent with respect to 100 parts by mass of silica (parts by mass) |  |  | 1.5 | 1.5 | 1.5 | 1.5 | 0.5 |
| Evaluation | Resin fluidity |  | 15 | 10 | 12 | 16 | 10 |
|  | Circuit packing |  | Good | Good | Good | Good | Good |
|  | Glass transition temperature (° C.) |  | 240 | 240 | 240 | 240 | 220 |
|  | Interlayer adhesiveness |  | Good | Good | Good | Good | Good |
|  | Heat resistance (seconds) |  | ↑120 | ↑120 | ↑120 | ↑120 | ↑120 |
|  | Relative dielectric constant |  | 3.7 | 3.7 | 3.7 | 3.6 | 3.6 |
|  | Dielectric tangent |  | 0.002 | 0.002 | 0.002 | 0.002 | 0.0011 |

|  |  |  | Examples |  |  |  |  |
|---|---|---|---|---|---|---|---|
|  |  |  | 15 | 16 | 17 | 18 | 19 |
| Composition (parts by mass) | PPE | Modified PPE-1 | — | — | — | — | — |
|  |  | Modified PPE-2 | 85 | 85 | 85 | 85 | 85 |
|  | Cross-linking curing agent | TAIC | — | — | — | — | — |
|  |  | DVB | 15 | 15 | 15 | 15 | 15 |
|  | Reaction initiator | Peroxide | — | — | 1 | 1 | 1 |
|  | Silane coupling agent | Phenylamino group | 5.00 | 9.00 | 1.00 | 1.00 | 1.00 |
|  | Compatible phosphorus compound | Phosphazene compound | — | — | 1 | 3 | 1 |
|  | Incompatible phosphorus compound | Phosphine oxide compound | — | — | — | — | 25 |
|  |  | Phosphinate compound | — | — | 20 | 17 | — |
|  | Dispersant | Phosphoric-acid-ester-based | — | — | — | — | — |
|  | Silica | Silica particles | 200 | 200 | 200 | 200 | 200 |
|  |  | Crushed silica | — | — | — | — | — |
| Content of silane coupling agent with respect to 100 parts by mass of silica (parts by mass) |  |  | 2.5 | 4.5 | 0.5 | 0.5 | 0.5 |
| Evaluation | Resin fluidity |  | 22 | 27 | 8 | 9 | 8 |
|  | Circuit packing |  | Good | Good | Good | Good | Good |
|  | Glass transition temperature (° C.) |  | 220 | 210 | 220 | 220 | 220 |
|  | Interlayer adhesiveness |  | Good | Good | Good | Good | Good |
|  | Heat resistance (seconds) |  | ↑120 | ↑120 | ↑120 | ↑120 | ↑120 |
|  | Relative dielectric constant |  | 3.6 | 3.7 | 3.7 | 3.6 | 3.6 |
|  | Dielectric tangent |  | 0.001 | 0.002 | 0.002 | 0.001 | 0.001 |

As can be seen from Tables 1 to 3, even when the resin composition containing the modified polyphenylene ether compound and the cross-linking curing agent contained a relatively large amount of 60 to 250 parts by mass of silica with respect to a total of 100 parts by mass of the modified polyphenylene ether compound and the cross-linking curing agent, the silane coupling agent having a phenylamino group in its molecule was contained in the resin composition (Examples 1 to 19). Examples 1 to 19 had more excellent dielectric properties, resin fluidity, circuit packing, interlayer adhesiveness, and heat resistance than those in the cases excluding Examples 1 to 19 (Comparative Examples 1 to 11). That is, the resin compositions according to Examples 1 to 19 had excellent dielectric properties, moldability, and heat-resistant reliability even when the resin compositions contained a relatively large amount of silica.

This is considered to be because the resin composition contains the silane coupling agent having a phenylamino group in its molecule. When the resin composition contains other silane coupling agent (silane coupling agent other than the silane coupling agent having a phenylamino group in its molecule) (Comparative Examples 1 to 5), the resin composition had poor resin fluidity and circuit packing, and insufficient moldability. When the content of silica exceeded 250 parts by mass with respect to a total of 100 parts by mass of the modified polyphenylene ether compound and the cross-linking curing agent (Comparative Example 6), the resin composition also had poor resin fluidity and circuit packing, and insufficient moldability. When the resin composition contained no silane coupling agent (Comparative Example 7), the resin composition had insufficient moldability. When the resin composition contained a dispersant in place of the silane coupling agent having a phenylamino group in its molecule (Comparative Examples 8 to 11), the resin composition had insufficient moldability. Therefore, it was found that the silane coupling agent having a phenylamino group in its molecule is added, whereby, even when the resin composition containing the modified polyphenylene ether compound and the cross-linking curing agent contains a relatively large amount of silica, the resin composition can maintain excellent dielectric properties, moldability, and heat-resistant reliability.

It was found that, when the content of the silane coupling agent having a phenylamino group in its molecule is 0.3 to 5 parts by mass with respect to 100 parts by mass of the silica (Examples 1 to 6), Examples 1 to 6 have more excellent moldability than that in the case where the content is less than 0.3 parts by mass (Example 7). It was found that Examples 1 to 6 have more excellent dielectric properties and heat-resistant reliability than those in the case where the content exceeds 5 parts by mass (Examples 8 and 9). From these, it is found that the content of the silane coupling agent having a phenylamino group in its molecule is preferably 0.3 to 5 parts by mass with respect to 100 parts by mass of the silica.

It was found that, even when the silica is contained in a relatively large amount so that the content of the silica is 60 to 250 parts by mass with respect to a total of 100 parts by mass of the modified polyphenylene ether compound and the cross-linking curing agent, even when the silica particles are used as the silica (Examples 1 to 3 and the like), or even when the crushed silica is used (Examples 10 to 13), the resin composition that provides the cured product having excellent dielectric properties, moldability, and heat-resistant reliability and containing a relatively large amount of silica is obtained.

Even when the modified polyphenylene ether in which the terminal hydroxyl group of the polyphenylene ether is modified with the methacryl group is used as the modified polyphenylene ether (Example 1 and the like), or even when the modified polyphenylene ether in which the terminal hydroxyl group of the polyphenylene ether is modified with the vinylbenzyl group (ethenylbenzyl group) (Examples 14 to 16) is used, the resin composition that provides the cured product having excellent dielectric properties, moldability, and heat-resistant reliability and containing a relatively large amount of silica is obtained. From this, it is found that the modified polyphenylene ether compound may be terminally modified with the substituent having an unsaturated carbon-carbon double bond.

It was found that, even when the compatible phosphorus compound and the incompatible phosphorus compound are contained so that the content of the compatible phosphorus compound is 3 to 19% by mass with respect to the total content of the compatible phosphorus compound and the incompatible phosphorus compound (Examples 17 to 19), the resin composition that provides the cured product having excellent dielectric properties, moldability, and heat-resistant reliability and containing a relatively large amount of silica is obtained.

This application is based on Japanese Patent Application No. 2017-135895 filed on Jul. 12, 2017, the contents of which are included in the present application.

The present invention has been appropriately and sufficiently explained above by way of embodiments, for the purpose of illustrating the invention. A person skilled in the art should recognize, however, that the embodiments described above can be easily modified and/or improved. Therefore, it is understood that any modified embodiments or improved embodiments conducted by a person skilled in the art are encompassed within the scope as claimed in the appended claims, so long as these modifications and improvements do not depart from the scope of the claims.

INDUSTRIAL APPLICABILITY

The present invention provides a resin composition that provides a cured product having excellent dielectric properties, moldability, and heat-resistant reliability and containing a relatively large amount of silica. The present invention can provide a prepreg, a metal foil with resin, a metal-clad laminate, and a wiring board that are obtained using the resin composition.

The invention claimed is:

1. A resin composition comprising:
   a modified polyphenylene ether compound terminally modified with a substituent having an unsaturated carbon-carbon double bond;
   a cross-linking curing agent having an unsaturated carbon-carbon double bond in its molecule;
   a silane coupling agent having a phenylamino group in its molecule;
   silica; and
   a flame retardant, wherein
      the flame retardant contains
         a compatible phosphorus compound that is compatible with a mixture of the modified polyphenylene ether compound and the cross-linking curing agent, and
         an incompatible phosphorus compound that is incompatible with the mixture,
   wherein a content of the silica is 60 to 250 parts by mass with respect to a total of 100 parts by mass of the modified polyphenylene ether compound and the cross-linking curing agent;
   wherein a content of the compatible phosphorus compound is 1 to 3.5 parts by mass with respect to a total of 100 parts by mass of the modified polyphenylene ether compound and the cross-linking curing agent;
   wherein a content of the incompatible phosphorus compound is 14 to 30 parts by mass with respect to a total of 100 parts by mass of the modified polyphenylene ether compound and the cross-linking curing agent; and
   wherein a content of the compatible phosphorus compound is 3 to 19% by mass with respect to a total content of the compatible phosphorus compound and the incompatible phosphorus compound.

2. The resin composition according to claim 1, wherein a content of the silane coupling agent is 0.3 to 5 parts by mass with respect to 100 parts by mass of the silica.

3. The resin composition according to claim 1, wherein the compatible phosphorus compound contains a phosphazene compound.

4. The resin composition according to claim 1, wherein the substituent contains a substituent having at least one selected from the group consisting of a vinylbenzyl group, an acrylate group, and a methacrylate group.

5. The resin composition according to claim 1, wherein the silica contains crushed silica or silica particles.

6. A prepreg comprising:
   the resin composition according to claim 1 or a semi-cured product of the resin composition; and
   a fibrous base material.

7. A film with resin, comprising:
   a resin layer containing the resin composition according to claim 1 or a semi-cured product of the resin composition; and
   a support film.

8. A metal foil with resin, comprising:
   a resin layer containing the resin composition according to claim 1 or a semi-cured product of the resin composition; and
   a metal foil.

9. A metal-clad laminate comprising:
   an insulating layer containing a cured product of the resin composition according to claim 1; and
   a metal foil.

10. A wiring board comprising:
    an insulating layer containing a cured product of the resin composition according to claim 1; and
    wiring.

* * * * *